(12) United States Patent
Bae et al.

(10) Patent No.: US 12,171,100 B2
(45) Date of Patent: Dec. 17, 2024

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventors: Byung Wook Bae, Icheon-si (KR); Eun Seok Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 333 days.

(21) Appl. No.: 17/717,896

(22) Filed: Apr. 11, 2022

(65) Prior Publication Data

US 2023/0125409 A1     Apr. 27, 2023

(30) Foreign Application Priority Data

Oct. 22, 2021   (KR) .......................... 10-2021-0141663

(51) Int. Cl.
| | |
|---|---|
| *H10B 43/40* | (2023.01) |
| *H10B 41/10* | (2023.01) |
| *H10B 41/27* | (2023.01) |
| *H10B 41/40* | (2023.01) |
| *H10B 43/10* | (2023.01) |
| *H10B 43/27* | (2023.01) |

(52) U.S. Cl.
CPC ............. *H10B 43/40* (2023.02); *H10B 41/10* (2023.02); *H10B 41/27* (2023.02); *H10B 41/40* (2023.02); *H10B 43/10* (2023.02); *H10B 43/27* (2023.02)

(58) Field of Classification Search
CPC ........ H10B 41/10; H10B 41/40; H10B 41/27; H10B 43/10; H10B 43/27; H10B 43/35; H10B 43/40; H10B 43/50; H01L 29/40114; H01L 29/41741; H01L 29/40117; H01L 29/7883
See application file for complete search history.

(56) References Cited

U.S. PATENT DOCUMENTS

| | | | |
|---|---|---|---|
| 10,840,260 B2 | 11/2020 | Kai et al. | |
| 10,903,237 B1 | 1/2021 | Hosoda et al. | |
| 2016/0322381 A1* | 11/2016 | Liu | ........................ H10B 41/27 |

(Continued)

FOREIGN PATENT DOCUMENTS

KR      1020200052497 A      5/2020

*Primary Examiner* — Brook Kebede
(74) *Attorney, Agent, or Firm* — WILLIAM PARK & ASSOCIATES LTD.

(57) ABSTRACT

There are provided a semiconductor memory device and a method of manufacturing the semiconductor memory device. The semiconductor memory device includes a gate stack comprising a plurality of first interlayer insulating patterns and a plurality of conductive patterns alternately stacked, a dummy stack comprising a plurality of second interlayer insulating patterns and a plurality of sacrificial insulating layers, a plurality of step-shaped grooves defined at different depths in the gate stack, a plurality of openings passing through the dummy stack and spaced apart from each other, a first gap-fill insulating pattern filling the plurality of step-shaped grooves, a second gap-fill insulating pattern filling the plurality of openings, a plurality of conductive gate contacts passing through the first gap-fill insulating pattern and connected to the plurality of conductive patterns, and a plurality of conductive peripheral circuit contacts passing through the second gap-fill insulating pattern.

16 Claims, 35 Drawing Sheets

(56) References Cited

U.S. PATENT DOCUMENTS

2017/0179154 A1* 6/2017 Furihata ............... H10B 41/41
2017/0352678 A1* 12/2017 Lu ........................ H10B 43/10
2021/0013221 A1 1/2021 Daycock et al.

* cited by examiner

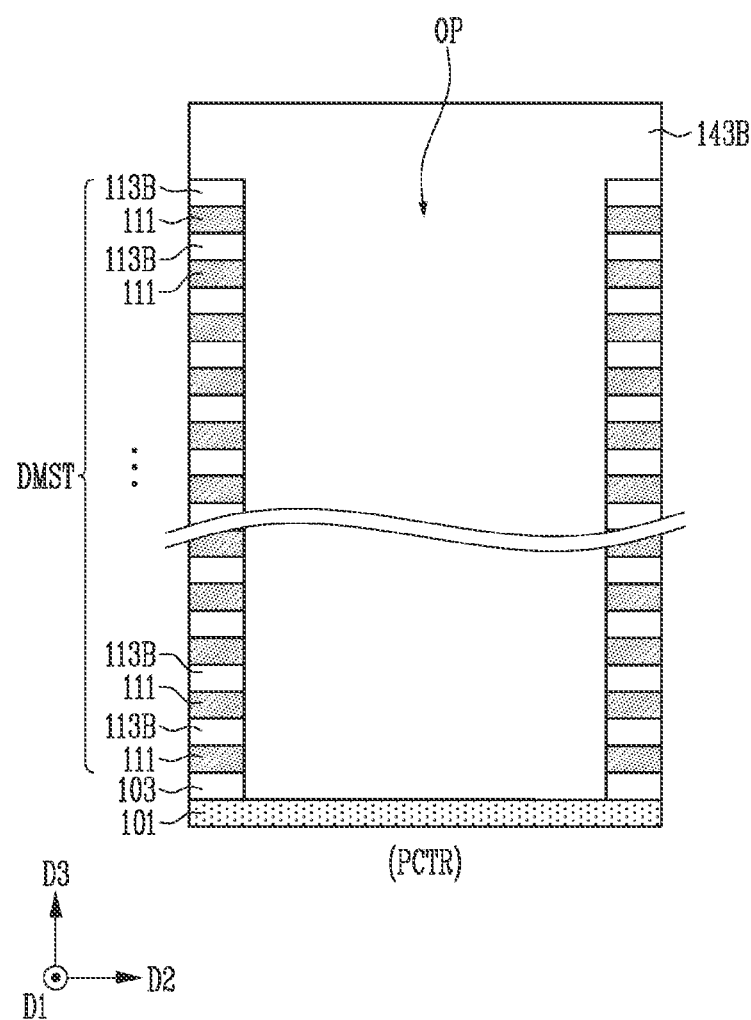

SEMICONDUCTOR MEMORY DEVICE AND METHOD OF MANUFACTURING SEMICONDUCTOR MEMORY DEVICE

CROSS-REFERENCE TO RELATED APPLICATION

The present application claims priority under 35 U.S.C. § 119(a) to Korean patent application number 10-2021-0141663 filed on Oct. 22, 2021, in the Korean intellectual Property Office, the entire disclosure of which is incorporated by reference herein.

BACKGROUND

1. Technical Field

The present disclosure relates to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device includes a memory cell array and a peripheral circuit structure connected to the memory cell array. The memory cell array includes a plurality of memory cells capable of storing data. The peripheral circuit structure may supply various operation voltages to the memory cells and may control various operations of the memory cells. To this end, the peripheral circuit structure may be electrically connected to the memory cell array. In addition, lines for transmitting an electrical signal from the peripheral circuit structure or for supplying an electrical signal to the peripheral circuit structure may be connected to the peripheral circuit structure.

SUMMARY

According to an embodiment of the present disclosure, a semiconductor memory device may include a gate stack including a cell array region and a gate contact region, and comprising a plurality of first interlayer insulating patterns and a plurality of conductive patterns alternately stacked, a dummy stack comprising a plurality of second interlayer insulating patterns and a plurality of sacrificial insulating layers alternately stacked in a direction in which the plurality of first interlayer insulating patterns and the plurality of conductive patterns are alternately stacked, a plurality of step-shaped grooves spaced apart from each other in the gate contact region of the gate stack and defined at different depths in the gate stack, a plurality of openings passing through the dummy stack and spaced apart from each other, a first gap-fill insulating pattern filling the plurality of step-shaped grooves, a second gap-fill insulating pattern filling the plurality of openings, a plurality of conductive gate contacts passing through the first gap-fill insulating pattern and connected to the plurality of conductive patterns, and a plurality of conductive peripheral circuit contacts passing through the second gap-fill insulating pattern.

According to an embodiment of the present disclosure, a method of manufacturing a semiconductor memory device may include forming a stack by alternately stacking a plurality of first material layers with a plurality of second material layers, forming a plurality of preliminary step-shaped grooves at a first depth in a gate contact region of the stack, forming a plurality of step-shaped grooves at different depths by etching a portion of the plurality of preliminary step-shaped grooves, and forming a plurality of openings spaced apart from each other in a peripheral circuit contact region of the stack by etching the peripheral circuit contact region of the stack while the plurality of preliminary step-shaped grooves are etched.

BRIEF DESCRIPTION OF THE DRAWINGS

FIGS. 15A, 15B, 15C, 16A, 16B, and 16C are diagrams illustrating a process of forming a plurality of conductive patterns.

DETAILED DESCRIPTION

Specific structural and functional descriptions disclosed herein are merely illustrative for the purpose of describing embodiments according to the concept of the present disclosure, Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

An embodiment of the present disclosure provides a semiconductor memory device and a method of manufacturing the semiconductor memory device capable of simplifying a manufacturing process.

Figure 1:
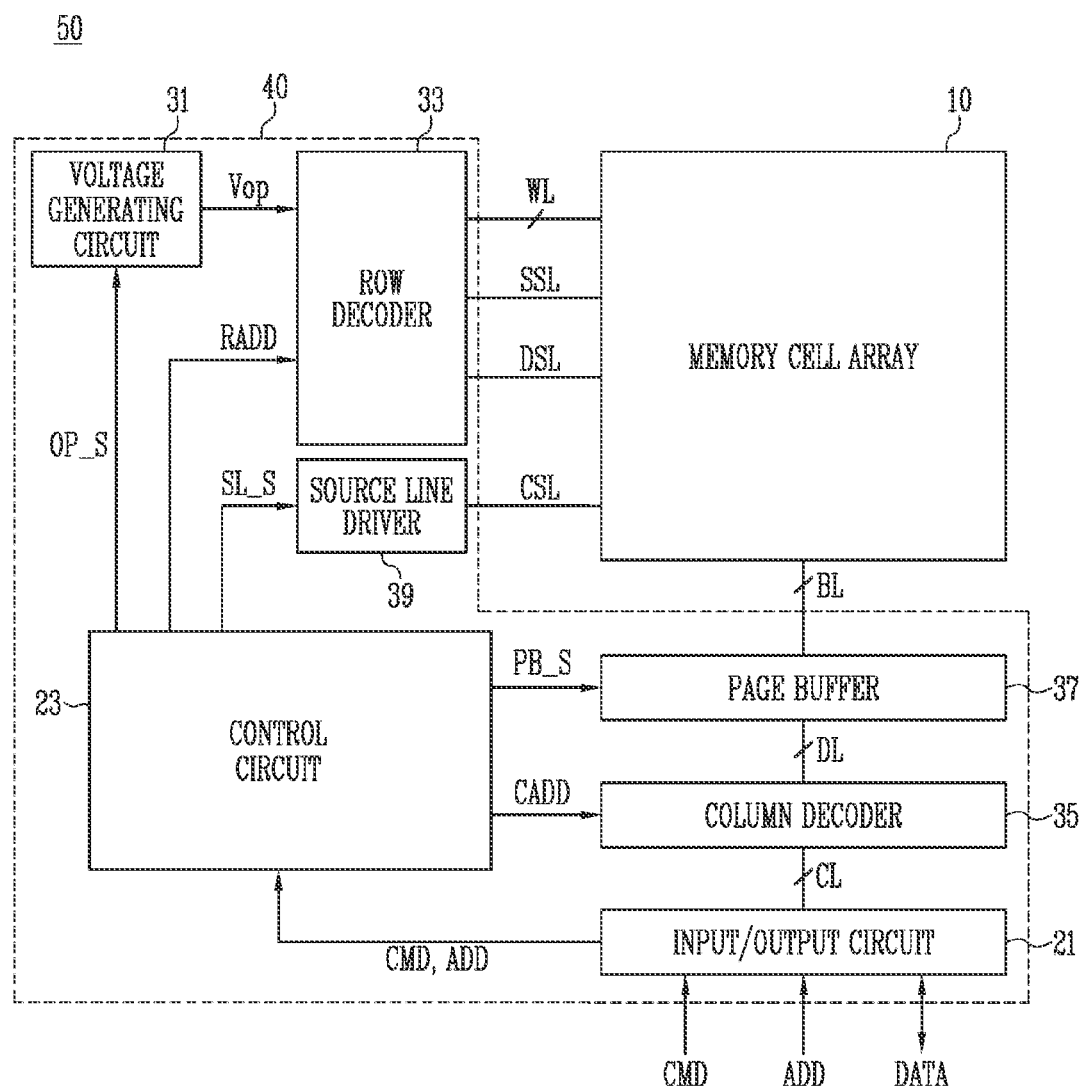
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, and an erase operation for erasing data stored in the memory cell array 10. As an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be arranged in a three dimension. The memory cell array 10 may be connected to a drain select line DSL, a plurality of word lines WL, a source select line SSL, a plurality of bit lines BL, and a common source line CSL.

The input/output circuit 21 may transmit a command CMD and an address ADD received from an external device (for example, a memory controller) of the semiconductor memory device 50 to the control circuit 23, The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operation voltages Vop used for the program operation, the read operation, and the erase operation in response to the operation signal OP_S.

The row decoder 33 may transmit the operation voltages Vop to the drain select line DSL, the word lines WL, and the source select line SSL in response to the row address RADD.

The column decoder 35 may transmit the data DATA input from the input/output circuit 21 to the page buffer 37 or transmit the data DATA stored in the page buffer 37 to the input/output circuit 21, in response to the column address CADD. The column decoder 35 may exchange the data DATA with the input/output circuit 21 through column lines CL. The column decoder 35 may exchange the data DATA with the page buffer 37 through data lines DL.

The page buffer 37 may temporarily store the data DATA received through the bit lines BL in response to the page buffer control signal PB_S. The page buffer 37 may sense a voltage or a current of the bit lines BL during the read operation.

The source line driver 39 may control a voltage applied to the common source line CSL in response to the source line control signal SL_S.

Figure 2:
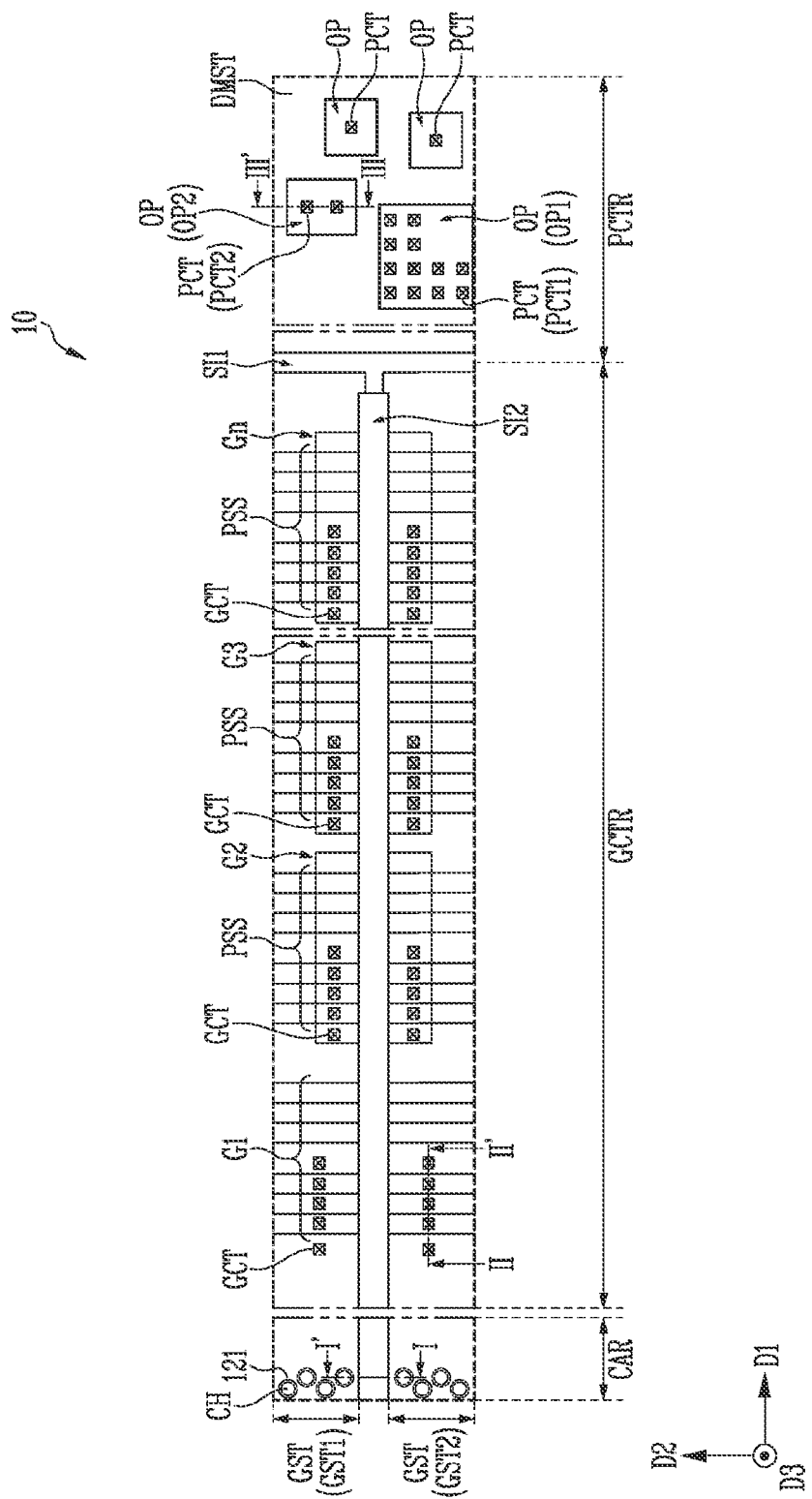
FIG. 2 is a plan view illustrating a portion of a semiconductor memory device according to an embodiment of the present disclosure.

In order to improve an integration degree of the semiconductor memory device, in some embodiments, the memory cell array 10 may be disposed to overlap a portion of the peripheral circuit structure 40, FIG. 2 is a plan view illustrating a portion of a semiconductor memory device according to an embodiment of the present disclosure.

Referring to FIG. 2, the semiconductor memory device may include the memory cell array 10 and a dummy stack DMST. The memory cell array 10 may include a plurality of gate stacks GST, a plurality of channel structures CH passing through the plurality of gate stacks GST, and a memory layer 121 surrounding each channel structure CH.

The plurality of gate stacks GST may be spaced apart from the dummy stack DMST by a first slit SI1. The first slit SI1 may be disposed between the plurality of gate stacks GST and the dummy stack DMST.

The plurality of gate stacks GST may include a first gate stack GST1 and a second gate stack GST2 spaced apart from each other. The first slit SI1 may extend in a direction crossing the first gate stack GST1 and the second gate stack GST2, The first gate stack GST1 may be spaced apart from the second gate stack GST2 by a second slit 512. The second slit 512 may be disposed between the first gate stack GST1 and the second gate stack GST2 and may be connected to the first slit SI1.

The first gate stack GST1 and the second gate stack GST2 may be structurally separated from each other by a connection structure of the first slit SI and the second slit SI2 and may be electrically separated from each other. Each of the first gate stack GST1 and the second gate stack GST2 may include a plurality of first horizontal patterns. The plurality of first horizontal patterns may include a plurality of conductive patterns 153 and a plurality of first interlayer insulating patterns 113A shown in FIGS. 3A and 3B. Each of the first horizontal patterns may extend in a first direction D1 and a second direction D2, and the plurality of first horizontal patterns may be stacked in a third direction D3. The first direction D1, the second direction D2, and the third direction D3 may be defined as directions in which axes crossing each other face. As an embodiment, the first direction D1, the second direction D2, and the third direction D3 may be defined as directions in which an X axis, a Y axis, and a Z axis of an XYZ coordinate system face, respectively.

Each of the first gate stack GST1 and the second gate stack GST2 may include a cell array region CAR and a gate contact region GCTR extending from the cell array region CAR toward the first slit SI1. Each channel structure CH may extend in the third direction D3 to pass through the cell array region CAR. The memory layer 121 may be disposed between the channel structure CH corresponding thereto and the gate stack GST1 or GST2 corresponding thereto. A plurality of step-shaped grooves G1 to Gn (n is a natural number equal to or greater than 2) may be defined in the gate contact region GCTR.

The plurality of step-shaped grooves G1 to Gn may be spaced apart from each other. The plurality of step-shaped grooves G1 to Gn may provide a contact region that is in contact with a plurality of conductive gate contacts GCT. The plurality of conductive gate contacts GCT may extend to different depths. The plurality of step-shaped grooves G1 to Gn may be defined at different depths in the gate stack GST1 or GST2 corresponding thereto. The plurality of step-shaped grooves G1 to Gn may include a first step-shaped groove G1 disposed at the highest level in the third direction D3 and an n-th step-shaped groove Gn disposed at the lowest level in the third direction D3. An embodiment of the present disclosure is not limited thereto, and the plurality of step-shaped grooves G1 to Gn may further include at least one step-shaped groove deeper than the first step-shaped groove G1 and disposed at a level higher than that of the n-th step-shaped groove Gn in the third direction D3, as well as the first step-shaped groove G1 and the n-th step-shaped groove Gn. For example, the plurality of step-shaped grooves G1 to Gn may include not only the first step-shaped groove G1 and the n-th step-shaped groove Gn, but also a second step-shaped groove G2 and a third step-shaped groove G3 disposed at different levels in the third direction D3. The second step-shaped groove G2 and the third step-shaped groove G3 may be located at a deeper depth than the first step-shaped groove G1 and may be disposed at the level higher than that of the n-th step-shaped groove Gn in the third direction D3.

The second to n-th step-shaped grooves G2 to Gn may be adjacent to a plurality of protrusion step-shaped structures PSS, and may be formed to be deeper than the plurality of protrusion step-shaped structures PSS, The plurality of protrusion step-shaped structures PSS may be disposed at the same level as the first step-shaped groove G1 and the third direction D3. Each of the protrusion step-shaped structures PSS may have the same cross-sectional structure as the first step-shaped grooves G1. Among the plurality of first horizontal patterns, a first horizontal pattern overlapping the plurality of protrusion step-shaped structures PSS in the third direction D3 may be continuous from the cell array region CAR toward the first slit SI1 without disconnection. To this end, the first step-shaped groove G1 and the plurality of protrusion step-shaped structures PSS may be arranged in a line from the cell array region CAR toward the first slit SI1.

The dummy stack DMST may be disposed in a peripheral circuit contact region PCTR of the semiconductor memory device. The peripheral circuit contact region PCTR may be provided as a region for a plurality of conductive peripheral circuit contacts PCT extending in the third direction D3. The plurality of conductive peripheral circuit contacts PCT may be spaced apart from each other in the first direction D1 and the second direction D2, The plurality of conductive peripheral circuit contacts PCT may electrically connect signal transmission lines (for example, TL shown in FIG. 5B) to the peripheral circuit structure 40 shown in FIG. 1. The signal transmission lines may be used as at least one of a power line and a ground line, or may be used as lines connected to the memory cell array 10.

The dummy stack DMST may include a plurality of second horizontal patterns. The plurality of second horizontal patterns may include a plurality of sacrificial insulating layers 111 and a plurality of second interlayer insulating patterns 113B shown in FIG. 3C. Each of the second horizontal patterns may extend in the first direction D1 and the second direction D2, The plurality of second horizontal patterns may be stacked in the third direction D3.

The plurality of conductive peripheral circuit contacts PCT may be disposed inside a plurality of openings OP spaced apart from each other. The plurality of openings OP may pass through the dummy stack DMST. A layout of the plurality of openings OP may be designed in consideration of a disposition of the plurality of conductive peripheral circuit contacts PCT. For example, the plurality of conductive peripheral circuit contacts PCT may include two or more first peripheral circuit contacts PCT1 clustered in a partial region of the peripheral circuit contact region PCTR and second peripheral circuit contacts PCT2 clustered in another region, the number of second peripheral circuit contacts PCT2 being less than the number of the first peripheral circuit contacts PCT1. The plurality of openings OP may include a first opening OP1 and a second opening OP2. The first peripheral circuit contacts PCT1 may be disposed inside the first opening OP1, and the second peripheral circuit contacts PCT2 may be disposed inside the second opening OP2. The cross-sectional area of the second opening OP2 for the second peripheral circuit contacts PCT2, having a relatively lessor number than the number of the first peripheral circuit contacts PCT1, may be defined to be narrower than the cross-sectional area of the first opening OP1 for the first peripheral circuit contacts PCT1.

As described above, the embodiment of the present disclosure provides the plurality of openings OP spaced apart from each other in the dummy stack DMST in consideration of the disposition of the plurality of conductive peripheral circuit contacts PCT, According to an embodiment of the present disclosure, structural stability may be improved compared to a case in which one opening is provided inside the dummy stack DMST in consideration of the entire region in which the plurality of conductive peripheral circuit contacts PCT are disposed. For example, the plurality of openings OP and the plurality of step-shaped grooves G1 to Gn may be filled with a gap-fill insulating layer. In some embodiments, as a difference between the area of each of the openings OP and the area of each of the step-shaped grooves G1 to Gn decreases, surface flatness of the gap-fill insulating layer may be improved. When, in some embodiments, the surface flatness of the gap-fill insulating layer is improved, structural stability of the semiconductor memory device may be improved, According to an embodiment of the present disclosure, the difference between the area of each of the openings OP and each of the step-shaped grooves G1 to Gn may be reduced, by controlling the area of each of the openings OP in consideration of a clustering aspect of the plurality of conductive peripheral circuit contacts PCT.

Figure 3A:
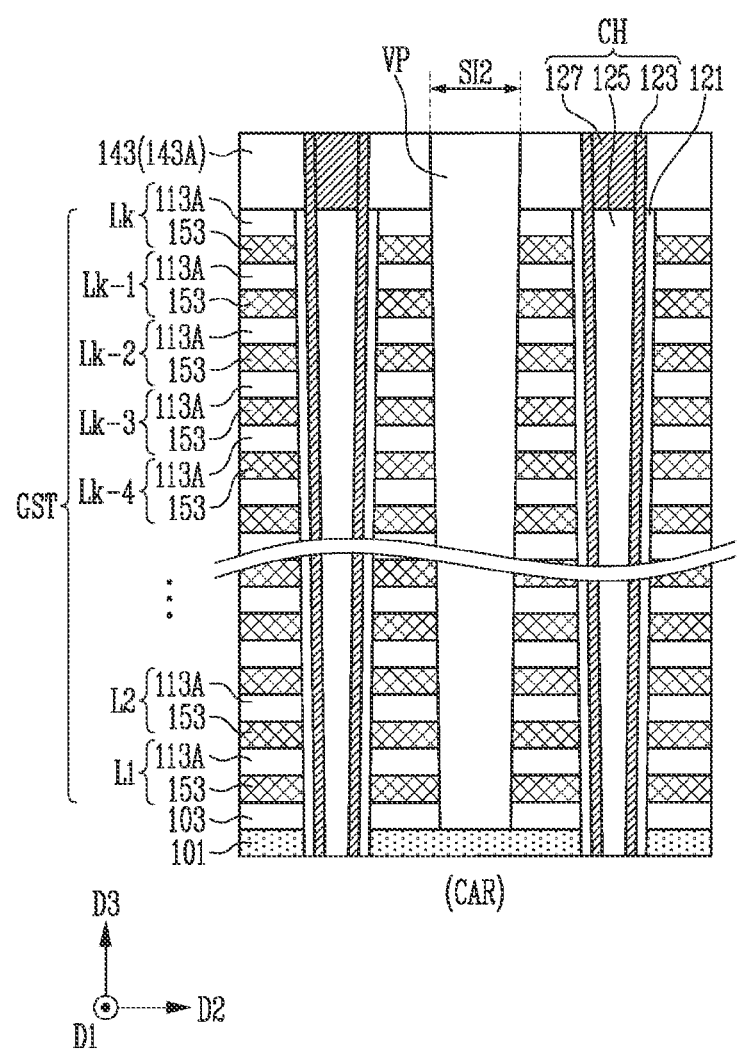
FIGS. 3A, 3B, and 3C are cross-sectional views of the semiconductor memory device shown in FIG. 2.
Figure 3B:
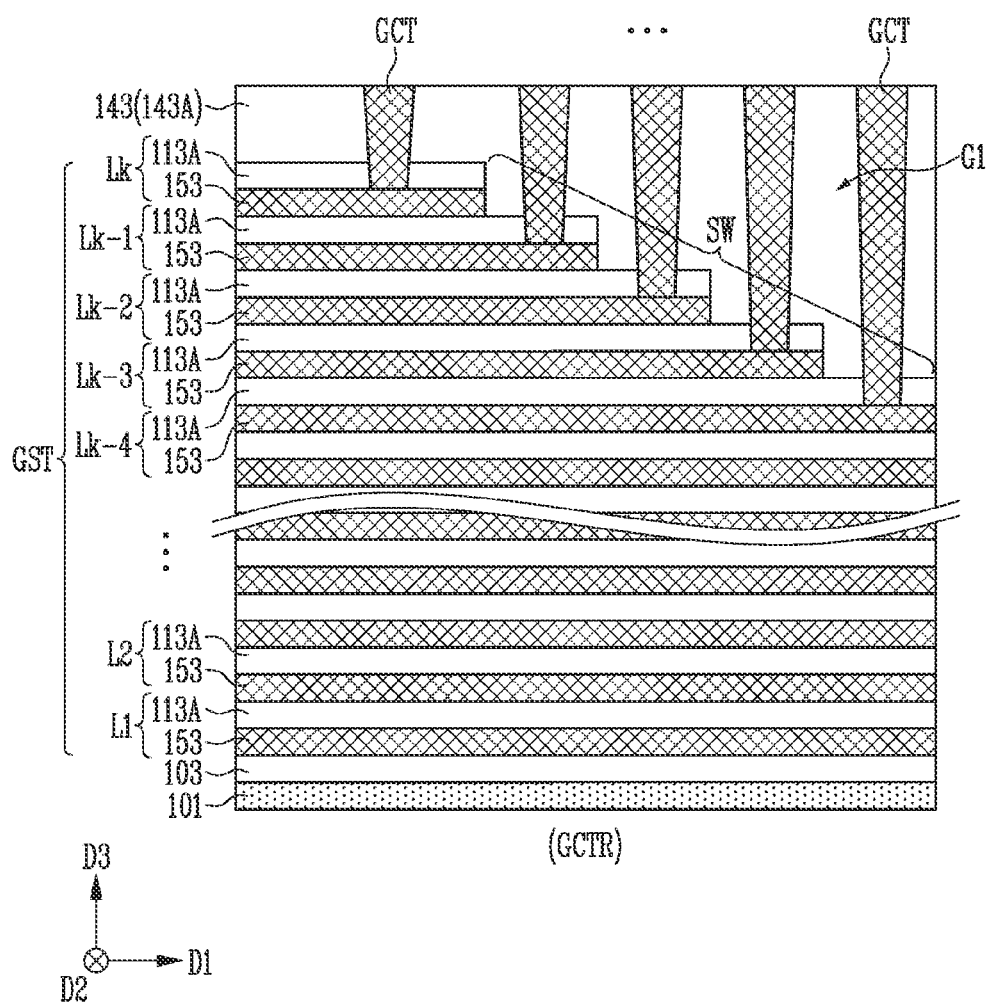
Figure 3C:
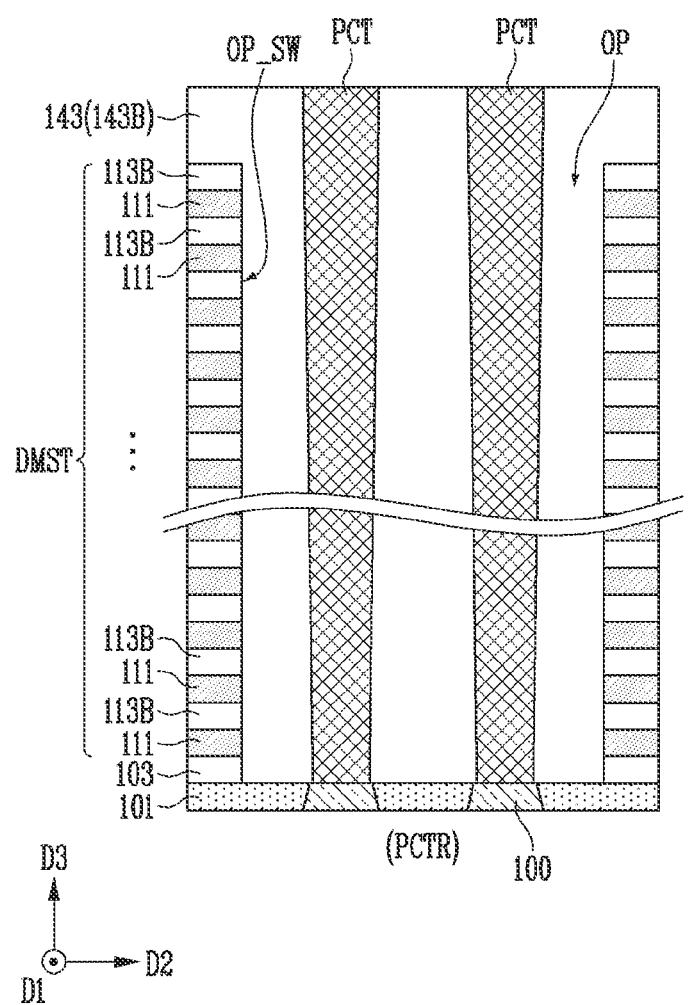

FIGS. 3A, 3B, and 3C are cross-sectional views of the semiconductor memory device shown in FIG. 2. FIG. 3A is a cross-sectional view illustrating the cell array region CAR of the gate stack GST taken along a line shown in FIG. 2. FIG. 3B is a cross-sectional view illustrating the gate contact region GCTR of the gate stack GST taken along a line II-IF shown in FIG. 2. FIG. 3C is a cross-sectional view illustrating the peripheral circuit contact region PCTR of the semiconductor memory device taken along a line shown in FIG. 2.

Referring to FIGS. 3A and 3B, the gate stack GST may include a plurality of conductive patterns 153 and a plurality of first interlayer insulating patterns 113A alternately disposed in the third direction D3. The plurality of conductive patterns 153 and the plurality of first interlayer insulating patterns 113A may configure a plurality of layers L1 to Lk (k is a natural number greater than n) stacked in the third direction D3. Each of the plurality of layers L1 to Lk may include a pair of patterns, each of the pairs of patterns including one conductive pattern 153 and one first interlayer insulating pattern 113A corresponding thereto. The plurality of layers L1 to Lk may be stacked from a first layer L1 disposed at the lowest layer toward a [k]-th layer Lk disposed at the highest layer. The plurality of layers L1 to Lk may configure a step-shaped sidewall SW of each of the plurality of step-shaped grooves G1 to Gn and the plurality of protrusion step-shaped structures PSS shown in FIG. 2.

The gate stack GST may be penetrated by the channel structure CH and the memory layer 121. The channel structure CH may include a channel layer 123. As an embodiment, the channel layer 123 may be formed in a tubular shape. In this case, the channel structure CH may further include a core insulating layer 125 and a capping pattern 127 filling a central region of the channel layer 123. The channel layer 123 and the capping pattern 127 may be formed of a semiconductor material such as silicon. The capping pattern 127 and a portion of the channel layer 123 that is in contact with the capping pattern 127 may configure a channel doping region including a conductive dopant. As an embodiment, the channel doped region may include an n-type impurity. The channel structure CH may protrude in the third direction D3 than the gate stack GST.

The memory layer 121 may be disposed between the gate stack GST and the channel structure CH. The memory layer 121 may be formed of various data storage materials such as a charge trap layer, a ferroelectric layer, a phase change material layer, a ferromagnetic material layer, and a nano dot. As an embodiment, the memory layer 121 may include a tunnel insulating layer between the gate stack GST and the channel structure CH, a data storage layer between the tunnel insulating layer and the gate stack GST, and a blocking insulating layer between the data storage layer and the gate stack GST, The data storage layer may be formed of silicon nitride for trapping a charge, and the tunnel insulating layer may be formed of silicon oxide capable of charge tunneling. The blocking insulating layer may be formed of an insulating material for blocking a charge. As an embodiment, the blocking insulating layer may include at least one of silicon oxide and metal oxide.

The gate stack GST may be covered with a first gap-fill insulating pattern 143A which is a portion of the gap-fill insulating layer 143. The first gap-fill insulating pattern 143A may fill the plurality of step-shaped grooves G1 to Gn and the plurality of protrusion step-shaped structures PSS shown in FIG. 2. The first gap-fill insulating pattern 143A may cover an upper end of the channel structure CH.

The second slit 512 may extend in the third direction D3 to pass through the first gap-fill insulating pattern 143A. The second slit 512 may be filled with a vertical structure VP formed of various materials. As an embodiment, the vertical structure VP may be formed of an insulating material filling the second slit 512.

The plurality of conductive gate contacts GCT may be disposed inside the plurality of step-shaped grooves G1 to Gn shown in FIG. 2, The plurality of conductive gate contacts GCT may contact the plurality of conductive patterns 153 through the plurality of step-shaped grooves G1 to Gn, respectively. To this end, the plurality of conductive gate contacts GCT may pass through the first gap-fill insulating pattern 143A, and may pass through the plurality of first interlayer insulating patterns 113A, respectively. For example, the first step-shaped groove G1 may include a bottom surface defined by a [k−4]-th layer Lk−4 and, a step-shaped side tall SW defined by a [k−3]-th layer Lk−3, a [k−2]-th layer Lk−2, a [k−1]-th layer Lk−1, and a [k]-th layer Lk. As described above, a conductive pattern 153 of the [k−4]-th layer Lk−4 overlapping the bottom surface of the first step-shaped groove G1, and conductive patterns 153 of the [k−3]-th layer Lk−3, the [k−2]-th layer Lk−2, and the [k−1]-th layer Lk−1 overlapping the step-shaped sidewall SW of the first step-shaped groove G1 may be in contact with the conductive gate contacts GCT corresponding thereto. The conductive gate contact GCT may extend in the third direction D3 to pass through the first interlayer insulating pattern 113A corresponding thereto and the first gap-fill insulating pattern 143A.

Referring to FIG. 3C the dummy stack DMST may include a plurality of sacrificial insulating layers 111 and a plurality of second interlayer insulating patterns 113B alternately disposed in the third direction D3. The plurality of sacrificial insulating layers 111 may be disposed at substantially the same levels as the plurality of conductive patterns 153 shown in FIGS. 3A and 3B, respectively. The plurality of second interlayer insulating patterns 113B may be disposed at substantially the same levels as the plurality of first interlayer insulating patterns 113A shown in FIGS. 3A and 3B, respectively. The plurality of second interlayer insulating patterns 113B may be formed of the same material as the plurality of first interlayer insulating patterns 113A shown in FIGS. 3A and 3B. The plurality of sacrificial insulating layers 111 may be formed of a material having an etch selectivity with respect to the plurality of second interlayer insulating patterns 113B, As an embodiment, the plurality of second interlayer insulating patterns 113B may be formed of silicon oxide, and the plurality of sacrificial insulating layers 111 may be formed of silicon nitride.

The plurality of sacrificial insulating layers 111 and the plurality of second interlayer insulating patterns 113B may be penetrated by the plurality of openings OP shown in FIG. 2. Each of the openings OP may be filled with a second gap-fill insulating pattern 143B which is another portion of the gap-fill insulating layer 143. The second gap-fill insulating pattern 143B may extend to cover the dummy stack DMST.

The plurality of conductive peripheral circuit contacts PCT may be disposed inside the plurality of openings OP shown in FIG. 2. The plurality of conductive peripheral circuit contacts PCT may pass through the second gap-fill insulating pattern 143B. The conductive peripheral circuit contacts PCT disposed in each opening OP and adjacent to each other may be insulated from each other by the second gap-fill insulating pattern 143B.

Each opening OP may include a sidewall OP_SW having flatness higher than that of the step-shaped sidewall SW shown in FIG. 3B. As an embodiment, the opening OP may include a straight-shaped sidewall.

Referring to FIGS. 3A, 3B, and 3C, the semiconductor memory device may include an etch stop layer 101 and a gate-source insulating layer 103. The gate stack GST and the dummy stack DMST may overlap each of the etch stop layer 101 and the gate-source insulating layer 103. The gate-source insulating layer 103 may be disposed between each of the gate stack GST and the dummy stack DMST and the etch stop layer 101. The gate-source insulating layer 103 may be formed of the same material as the first interlayer insulating patterns 113A and the second interlayer insulating patterns 113B. The etch stop layer 101 may be formed of a material different from that of the gap-fill insulating layer 143 for selective etching of the gap-fill insulating layer 143. In other words, the gap-fill insulating layer 143 may have an etch selectivity with respect to the etch stop layer 101. As an embodiment, the gap-fill insulating layer 143 may be formed of silicon oxide, and the etch stop layer 101 may be formed of at least one of silicon nitride, silicon, and silicon carbide (for example, SiCO, and SiCN). The etch stop layer 101 may have an etch resistance when the gap-fill insulating layer 143 is etched, FIGS. 3A to 3C show a case in which the etch stop layer 101 is formed of an insulating material such as silicon nitride or silicon carbide.

The gate-source insulating layer 103 may be penetrated by the second slit 512, the vertical structure VP, and the opening OP, The etch stop layer 101 may define a bottom surface of the opening OP, and the etch stop layer 101 may include a portion that is in contact with the second gap-fill insulating pattern 143B, The etch stop layer 101 may be penetrated by a plurality of conductive contact plugs 100 respectively contacting the plurality of conductive peripheral circuit contacts PCT. The etch stop layer 101 may be penetrated by the channel structure CH and the memory layer 121. The second slit SI2 and the vertical structure VP may be formed at a depth passing through the etch stop layer 101, or may include a bottom surface that is in contact with the etch stop layer 101 as shown in FIG. 3A.

Figure 4A:
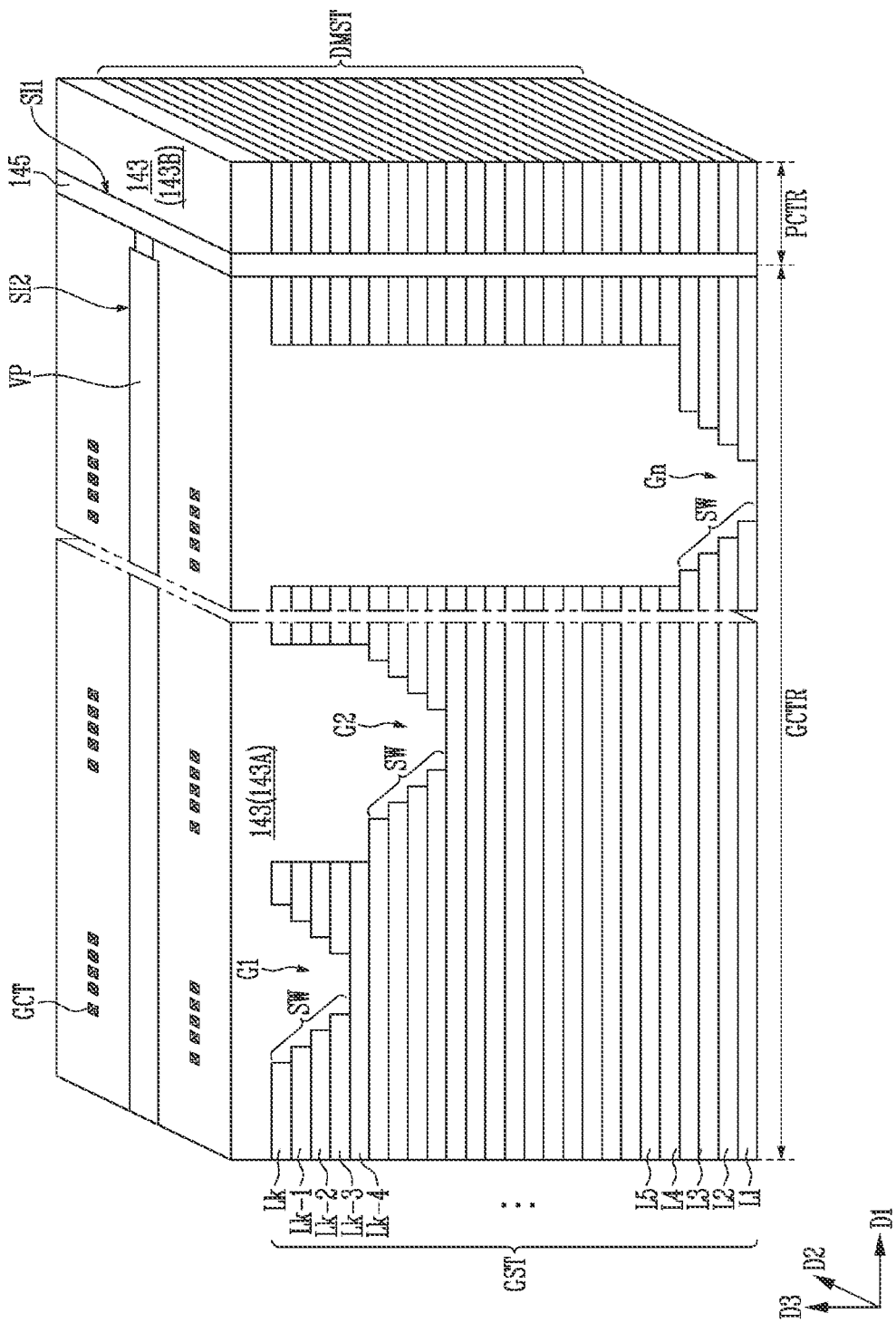
FIGS. 4A and 4B are perspective views illustrating a portion of the semiconductor memory device shown in FIG. 2.
Figure 4B:
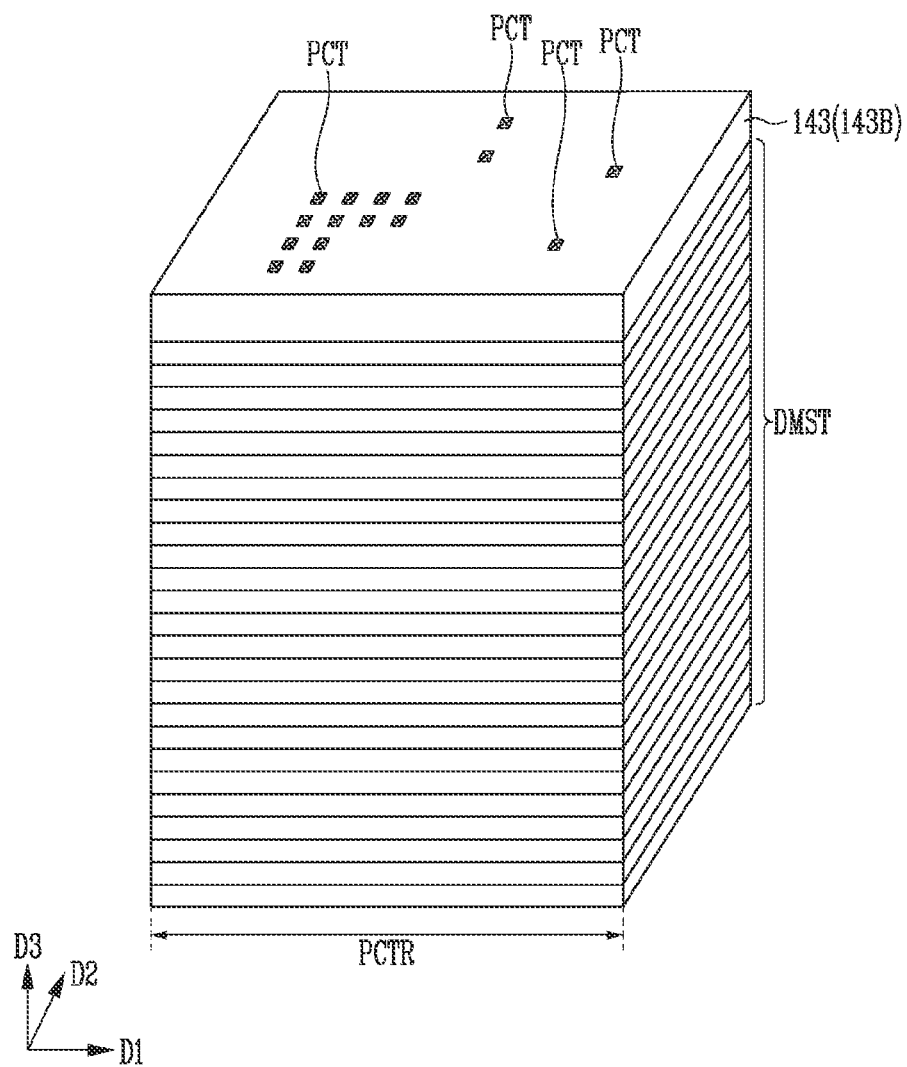

FIGS. 4A and 4B are perspective views illustrating a portion of the semiconductor memory device shown in FIG. 2. FIG. 4A illustrates the gate contact region GCTR of the gate stack GST and a portion of the dummy stack DMST adjacent thereto. FIG. 4B shows another portion of the dummy stack DMST.

Referring to FIGS. 4A and 4B, the plurality of step-shaped grooves G1 to Gn inside the gate stack GST and the plurality of openings OP inside the dummy stack DMST may be filled with the gap-fill insulating layer 143, The gap-fill insulating layer 143 may be divided into the first gap-fill insulating pattern 143A and the second gap-fill insulating pattern 143B by the first slit SI1. The first slit SI1 may be filled with a slit insulating layer 145.

The second slit SI2 and the vertical structure VP may extend along the gate stack GST, The plurality of layers L1 to Lk of the gate stack GST may define the plurality of step-shaped grooves G1 to Gn having the step-shaped sidewall SW. The plurality of step-shaped grooves G1 to Gn may be disposed at different depths. The first step-shaped groove G1 may be disposed at the highest level in the third direction D3 among the plurality of step-shaped grooves G1 to Gn. For example, the first step-shaped groove G1 may have the sidewall SW defined by the [k−3]-th layer Lk−3, the [k−2]-th layer Lk−2, the [k−1]-th layer Lk−1, and the [k]-th layer Lk. The n-th step-shaped groove Gn may be disposed at the lowest level in the third direction D3. For example, the n-th step-shaped groove Gn may have the step-shaped sidewall SW defined by the first layer L1, a second layer L2, a third layer L3, and a fourth layer L4.

The plurality of conductive gate contacts GCT may respectively overlap ends of the plurality of layers L1 to Lk configuring the step-shaped sidewall SW in the third direction D3 and may pass through the first gap-fill insulating pattern 143A.

The plurality of conductive peripheral circuit contacts PCT may pass through the second gap-fill insulating pattern 143B.

The configurations described with reference to FIGS. 2, 3A to 3C, 4A, and 4B may overlap the peripheral circuit structure. The gate stack GST described with reference to FIGS. 2, 3A to 3C, 4A and 4B may be disposed between the bit line and the peripheral circuit structure, or between the peripheral circuit structure and a doped semiconductor layer. The doped semiconductor layer may be a layer connected to the common source line controlled by the source line driver 39 shown in FIG.

Figure 5A:
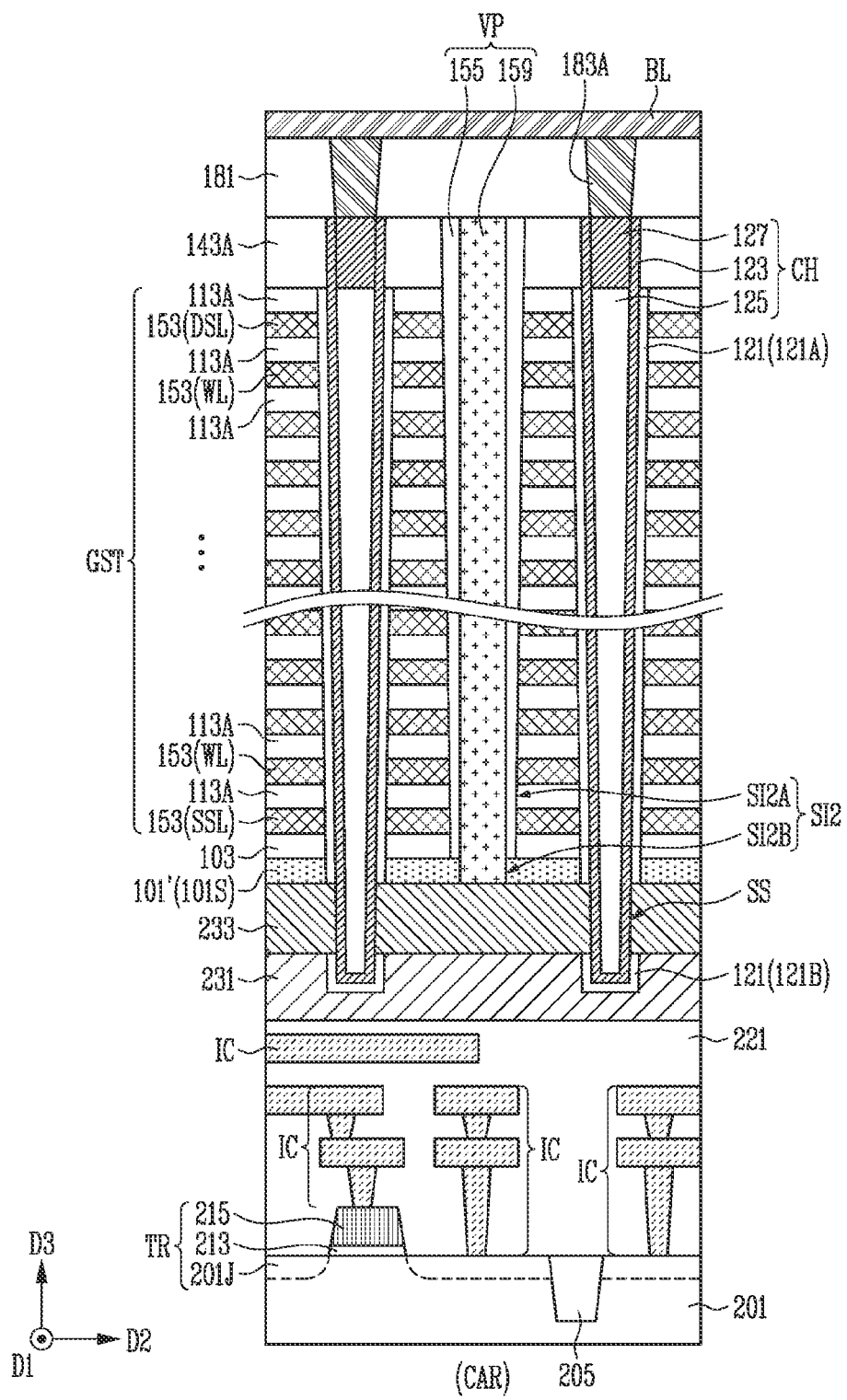
FIGS. 5A and 5B are cross-sectional views illustrating partial regions of a semiconductor memory device according to an embodiment of the present disclosure.
Figure 5B:
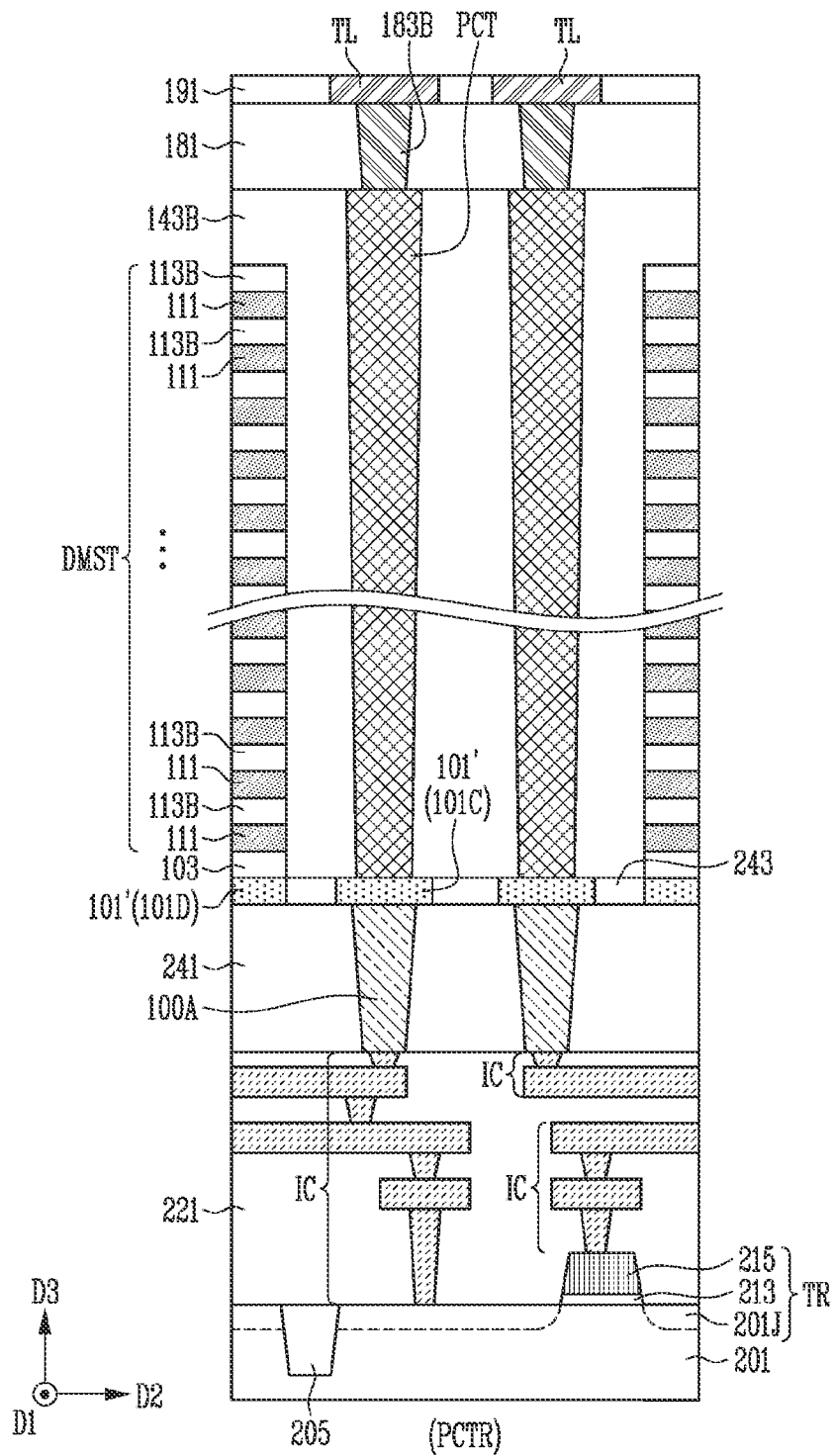

FIGS. 5A and 5B are cross-sectional views illustrating partial regions of a semiconductor memory device according to an embodiment of the present disclosure. FIGS. 5A and 5B illustrate an embodiment of the semiconductor memory device including the gate stack GST disposed between the bit line BL and the peripheral circuit structure, FIG. 5A illustrates the cell array region CAR of the gate stack GST, and FIG. 5B illustrates the peripheral circuit contact region PCTR of the semiconductor memory device. Hereinafter, a repetitive description of the same configurations as those shown in FIGS. 2, 3A to 3C, 4A, and 4B is omitted.

Referring to FIGS. 5A and 5B, the peripheral circuit structure 40 shown in FIG. 1 may include a plurality of transistors TR. Each transistor TR may include a gate insulating layer 213, a gate electrode 215, and junctions 2013, The gate insulating layer 213 and the gate electrode 215 may be stacked on an active region of a semiconductor substrate 201. The active region of the semiconductor substrate 201 may be partitioned by an isolation layer 205 buried in the semiconductor substrate 201. The junctions 2013 may be defined as a region in which at least one of an n-type impurity and a p-type impurity is implanted into the active region of the semiconductor substrate 201 at both sides of the gate electrode 215, The junctions 2013 may be provided as a source region and a drain region of the transistor TR corresponding thereto.

The semiconductor substrate 201 may include a region overlapped by the gate stack GST and the peripheral circuit contact region PCTR. The peripheral circuit contact region PCTR of the semiconductor substrate 201 may overlap the dummy stack DMST. The plurality of transistors TR may include a transistor overlapped by the gate stack GST and a transistor disposed in the peripheral circuit contact region PCTR, The plurality of transistors TR may be connected to a plurality of interconnections IC disposed on the semiconductor substrate 201. Each interconnection IC may include conductive patterns disposed on two or more layers and connected to each other.

The semiconductor substrate 201 and the plurality of transistors TR may be covered with a lower insulating structure 221. The plurality of interconnections IC may be buried in the lower insulating structure 221. The lower insulating structure 221 may include two or more insulating layers.

A first doped semiconductor layer 231 may be disposed on the lower insulating structure 221, and a second doped semiconductor layer 233 may be disposed on the first doped semiconductor layer 231. Each of the first doped semiconductor layer 231 and the second doped semiconductor layer 233 may include at least one of an n-type impurity and a p-type impurity. As an embodiment, each of the first doped semiconductor layer 231 and the second doped semiconductor layer 233 may include an n-type impurity. The first doped semiconductor layer 231 and the second doped semiconductor layer 233 may be disposed between the gate stack GST and the lower insulating structure 221. The first doped semiconductor layer 231 and the second doped semiconductor layer 233 may be penetrated by a source insulating layer 241. The source insulating layer 241 may overlap the peripheral circuit contact region PCTR of the semiconductor substrate 201.

The structure described with reference to FIGS. 2, 3A to 3C, 4A and 4B may be disposed on the second doped semiconductor layer 233 and the source insulating layer 241. For example, an etch stop layer 101' and the gate-source insulating layer 103 may be stacked on the second doped semiconductor layer 233. The etch stop layer 101' and the gate-source insulating layer 103 may extend to overlap the source insulating layer 241. The gate stack GST and the dummy stack DMST may overlap the plurality of transistors TR with the etch stop layer 101' interposed therebetween. FIGS. 5A and 5B illustrates a case in which the etch stop layer 101' is formed of a conductive material such as silicon. The etch stop layer 101' formed of a conductive material may be separated into a plurality of patterns by the insulating layer 243. As an embodiment, the etch stop layer 101' may be separated into a source pattern 101S overlapping the gate stack GST, a dummy pattern 101D overlapping the dummy stack DMST, and a contact pattern 101C overlapping the conductive peripheral circuit contact PCT.

The source insulating layer 241 overlapping the peripheral circuit contact region PCTR of the semiconductor substrate 201 may be penetrated by a plurality of conductive contact plugs 100A. Each of the plurality of conductive plugs 100A may be connected to the interconnection IC corresponding thereto. Each conductive plug 100A may be connected to the conductive peripheral circuit contact PCT corresponding thereto via a contact pattern 101O corresponding thereto.

The channel structure CH and the memory layer 121 may pass through the plurality of conductive patterns 153 and the plurality of first interlayer insulating patterns 113A of the gate stack GST, and may pass through the gate-source insulating layer 103 and the source pattern 101S of the etch stop layer 101'.

The channel layer 123 and the core insulating layer 125 of the channel structure CH may pass through the second doped semiconductor layer 233 and extend into the first doped semiconductor layer 231. The channel layer 123 of the channel structure CH may have a sidewall SS that is in contact with the second doped semiconductor layer 233. The second doped semiconductor layer 233 may surround the sidewall SS of the channel layer 123.

The memory layer 121 may be separated into a first memory pattern 121A and a second memory pattern 121B by the second doped semiconductor layer 233. The first memory pattern 121A may be defined as a portion of the memory layer 121 extending along a sidewall of the gate stack GST, a sidewall of the gate-source insulating layer 103, and a sidewall of the source pattern 101S. The second memory pattern 121B may be defined as a portion of the memory layer 121 disposed between the channel structure CH and the first doped semiconductor layer 231.

The plurality of conductive patterns 153 of the gate stack GST may be used as the source select line SSL, the word line WL, and the drain select line DSL. As an embodiment, the source select line SSL may be formed of a conductive pattern closest to the first doped semiconductor layer 231 among the plurality of conductive patterns 153, and the drain select line DSL may be formed of a conductive pattern disposed farthest from the first doped semiconductor layer 231 among the plurality of conductive patterns 153. Each of remaining conductive patterns between the conductive pattern used as the source select line SSL and the conductive pattern used as the drain select line DSL among the plurality of conductive patterns 153 may be used as the word line WL.

The gate stack GST may be spaced apart from the dummy stack DMST by the first slit 511 as shown in FIG. 4A. The second slit SI2 may include a gate passing through portion SI2A and an extension portion SI2B as shown in FIG. 5A. The gate passing through portion SI2A may pass through the first gap-fill insulating pattern 143A, the gate stack GST, and the gate-source insulating layer 103. The extension portion SI2B may pass through the etch stop layer 101'.

The vertical structure VP may include a conductive vertical contact structure 159 and a spacer insulating layer 155 between the conductive vertical contact structure 159 and the gate stack GST, The spacer insulating layer 155 may extend along a sidewall of the gate passing through portion SI2A of the second slit SI2, The conductive vertical contact structure 159 may be insulated from the plurality of conductive patterns 153 by the spacer insulating layer 155. The conductive vertical contact structure 159 may extend along an extension direction of the spacer insulating layer 155 and may pass through the etch stop layer 101'. The conductive vertical contact structure 159 may be in contact with the second doped semiconductor layer 233.

The second doped semiconductor layer 233 may be electrically connected to the source line driver 39 of the peripheral circuit structure 40 shown in FIG. 1 via the conductive vertical contact structure 159.

The second gap-fill insulating pattern 143B may pass through the plurality of sacrificial insulating layers 111 and the plurality of second interlayer insulating patterns 113B of the dummy stack DMST, and may pass through the gate-source insulating layer 103. A portion of the second gap-fill insulating pattern 143B may be in contact with the contact pattern 101O of the etch stop layer 101'.

The plurality of conductive peripheral circuit contacts PCT may pass through the second gap-fill insulating pattern 143B. Each conductive peripheral circuit contact PCT may be electrically connected to the conductive contact plug 100A corresponding thereto via the contact pattern 101O corresponding thereto. As another embodiment, when the etch stop layer 101' is formed of an insulating material, the plurality of conductive peripheral circuit contacts PCT may be in contact with the plurality of conductive contact plugs 100A extending to pass through the etch stop layer 101'.

The first gap-fill insulating pattern 143A and the second gap-fill insulating pattern 143B may be covered with a first insulating layer 181. The first insulating layer 181 may be penetrated by a plurality of conductive contacts 183A and 183B. The plurality of conductive contacts 183A may include a first contact 183A connected to the capping pattern 127 of the channel structure CH and a second contact 183B connected to the conductive peripheral circuit contact PCT.

The first insulating layer 181 may be covered with a second insulating layer 191. The second insulating layer 191 may be penetrated by the bit line BL and the signal transmission line IL. The bit line BL may be connected to the first contact 183A, and the signal transmission line TL may be connected to the second contact 183B. The bit line BL may be electrically connected to the channel structure CH via the first contact 183A. The signal transmission line TL may be electrically connected to the transistor TR of the peripheral circuit structure via the second contact 183B, the conductive peripheral circuit contact PCT, the conductive contact plug 100A, and the interconnection IC.

A structure of the doped semiconductor layer that is in contact with the channel layer 123 may be variously designed.

Figure 6:
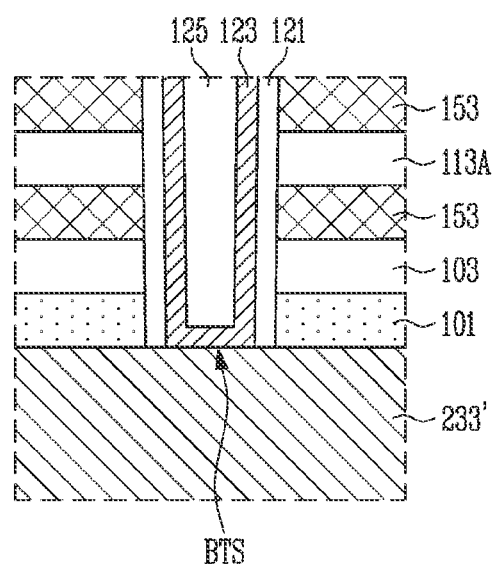
FIG. 6 is a cross-sectional view illustrating an embodiment of a contact structure between a doped semiconductor layer and a channel layer.

FIG. 6 is a cross-sectional view illustrating an embodiment of a contact structure between a doped semiconductor layer and a channel layer. Hereinafter, a repetitive description of the same configurations as those shown in FIGS. 2, 3A to 3C, 4A, and 4B is omitted.

Referring to FIG. 6, the etch stop layer 101, the gate-source insulating layer 103, the conductive pattern 153, and the first interlayer insulating pattern 113A may be disposed on a doped semiconductor layer 233' as described above with reference to FIG. 5A. The doped semiconductor layer 233' may include a conductivity impurity. As an embodiment, the doped semiconductor layer 233' may include an n-type impurity. The doped semiconductor layer 233' may be controlled by the source line driver 39 shown in FIG. 1.

The memory layer 121, the channel layer 123, and the core insulating layer 125 may pass through the etch stop layer 101. The channel layer 123 may include a bottom surface BTS that is in contact with the doped semiconductor layer 233'.

Figure 7A:
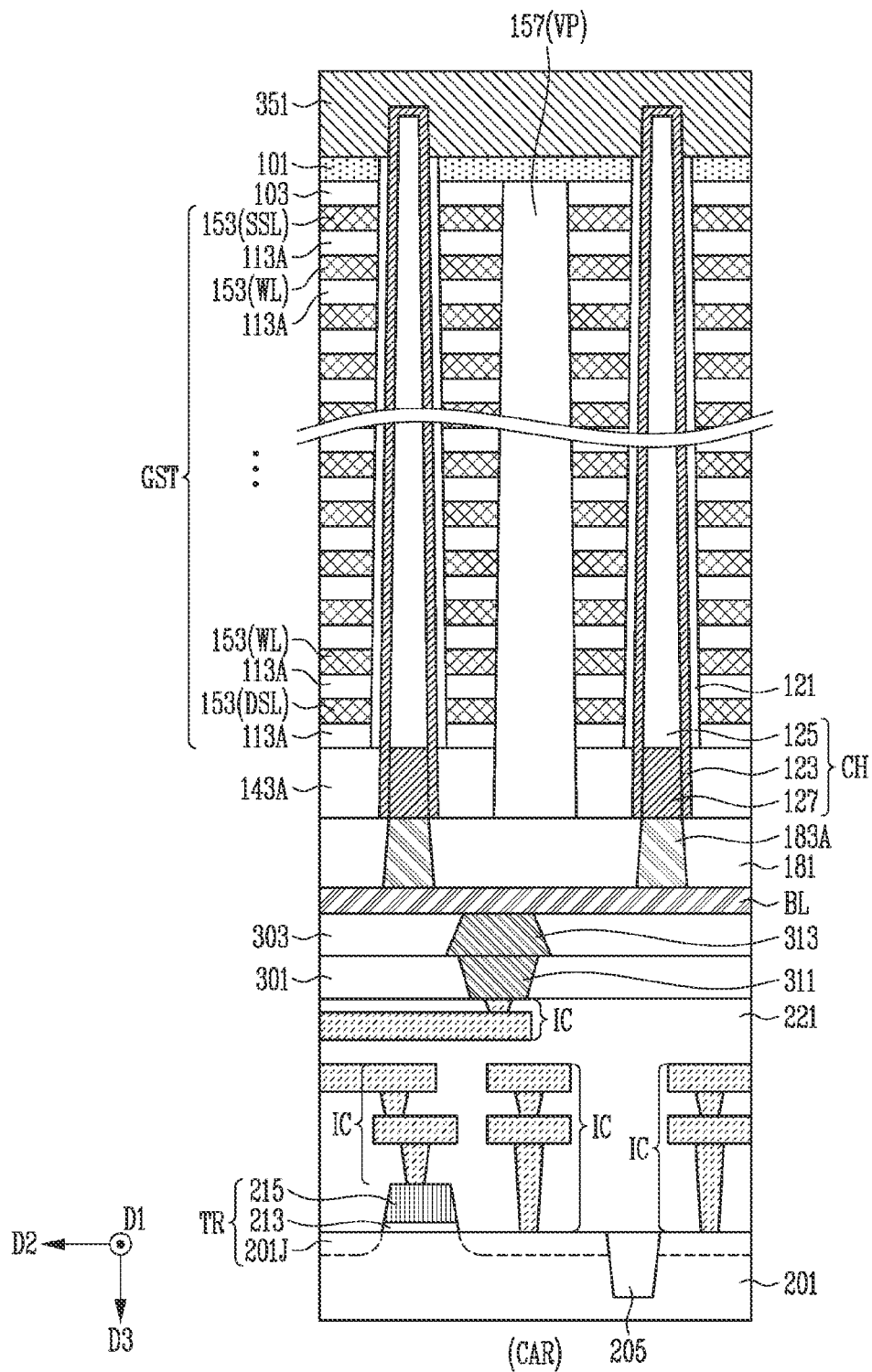
FIGS. 7A and 7B are cross-sectional vie s illustrating partial regions of a semiconductor memory device according to an embodiment of the present disclosure.
Figure 7B:
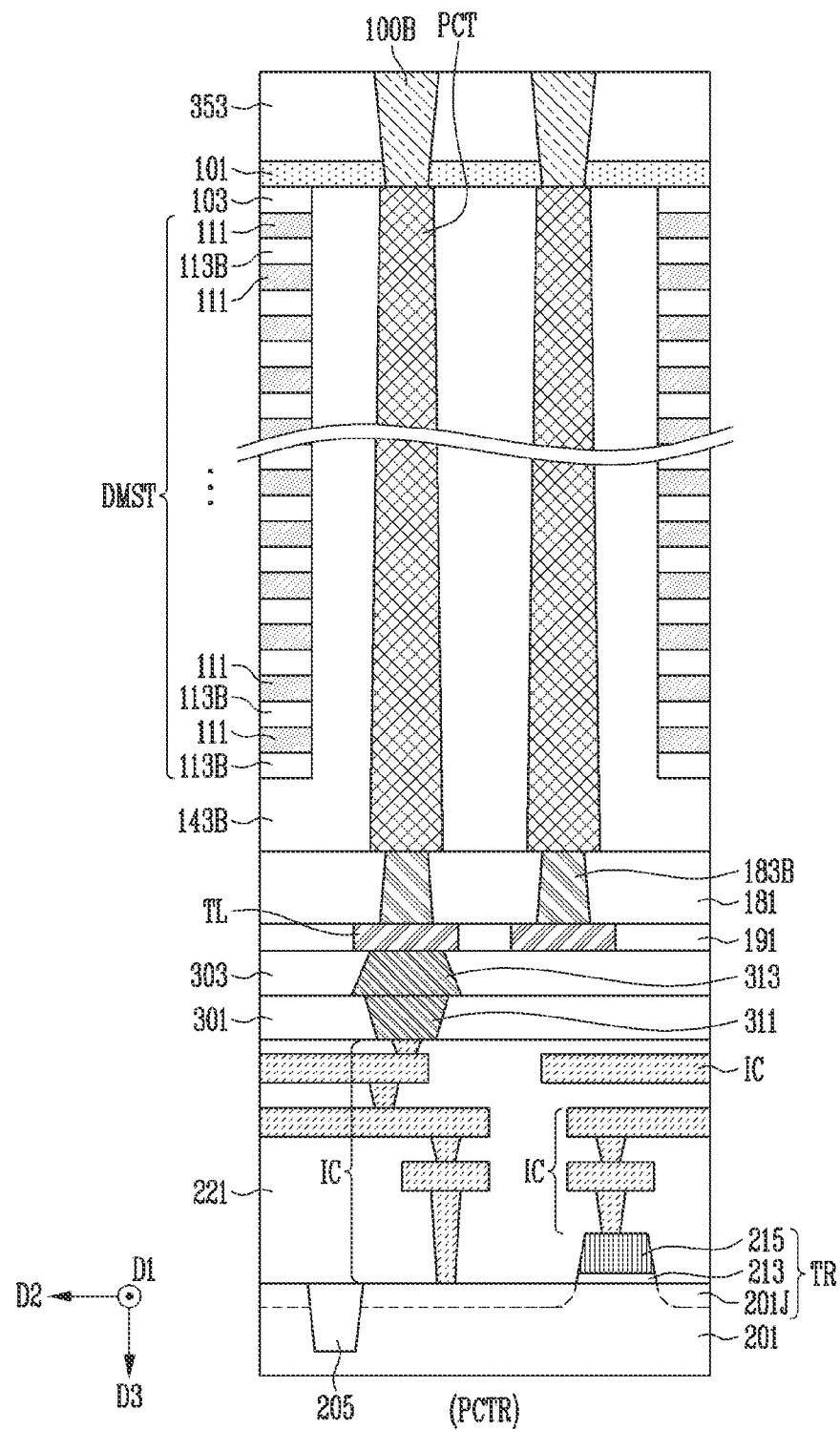

FIGS. 7A and 7B are cross-sectional views illustrating partial regions of a semiconductor memory device according to an embodiment of the present disclosure. FIGS. 7A and 7B illustrate an embodiment of a semiconductor memory device including a bonding structure. FIGS. 7A and 7B illustrate an embodiment of a semiconductor memory device including the gate stack GST disposed between the peripheral circuit structure and a doped semiconductor layer 351. FIG. 7A illustrates the cell array region CAR of the gate stack GST, and FIG. 7B illustrates the peripheral circuit contact region PCTR of the semiconductor memory device. Hereinafter, a repetitive description of the same configurations as those shown in FIGS. 2, 3A to 3C, 4A, 4B, 5A, and 5B is omitted.

Referring to FIGS. 7A and 7B, the peripheral circuit structure may include the plurality of transistors TR as described with reference to FIGS. 5A and 5B. In addition, each transistor TR may be disposed in the active region of the semiconductor substrate 201 partitioned by the isolation layer 205 as described with reference to FIGS. 5A and 5B. Each transistor TR may include the gate insulating layer 213, the gate electrode 215, and the junctions 2013 as described with reference to FIGS. 5A and 5B.

The plurality of interconnections IC connected to the plurality of transistors TR may be connected to a plurality of first conductive bonding pads 311. The plurality of first conductive bonding pads 311 may be disposed on the lower insulating structure 221. The lower insulating structure 221 may be covered with a first bonding insulating layer 301. The plurality of first conductive bonding pads 311 may pass through the first bonding insulating layer 301.

The first bonding insulating layer 301 may be covered with a second bonding insulating layer 303, The second bonding insulating layer 303 may be bonded to the first bonding insulating layer 301. Each of the first bonding insulating layer 301 and the second bonding insulating layer 303 may include silicon oxide, silicon oxynitride, silicon carbonitride, or the like.

The second bonding insulating layer 303 may be penetrated by a plurality of second conductive bonding pads 313. The plurality of second conductive bonding pads 313 may be bonded to the plurality of first conductive bonding pads 311. The plurality of first conductive bonding pads 311 and the plurality of second conductive bonding pads 313 may include copper, a copper alloy, or the same type of metal.

The gate stack GST and the dummy stack DMST shown in FIGS. 2, 3A to 3C, 4A and 4B may be disposed in a vertically inverted structure on the second conductive bonding pads 313 and the second bonding insulating layer 303. For example, a direction in which the second bonding insulating layer 303 faces the semiconductor substrate 201 may be defined as the third direction D3 shown in FIGS. 2, 3A to 3C, 4A, and 4B.

The first gap-fill insulating pattern 143A may be disposed between the second bonding insulating layer 303 and the gate stack GST. The second gap-fill insulating pattern 143B may be disposed between the second bonding insulating layer 303 and the dummy stack DMST. The first insulating layer 181 and the second insulating layer 191 may be disposed between the first gap-fill insulating pattern 143A and the second bonding insulating layer 303 and between the second gap-fill insulating pattern 143B and the second bonding insulating layer 303. The first insulating layer 181 may be penetrated by the first contact 183A and the second contact 183B, and the second insulating layer 191 may be penetrated by the bit line BL and the signal transmission line TL, The first insulating layer 181, the second insulating layer 191, the first contact 183A, the second contact 183B, the bit line BL, and the signal transmission line TL may be disposed on the second bonding insulating layer 303 in a vertically inverted structure compared to the same configurations shown in FIGS. 5A and 5B.

The plurality of conductive patterns 153 of the gate stack GST may be used as the source select line SSL, the word line WL, and the drain select line DSL. As an embodiment, the source select line SSL may be formed of a conductive pattern disposed farthest from the bit line BL among the plurality of conductive patterns 153, and the drain select line DSL may be formed of a conductive pattern closet to the bit line BL. Each of remaining conductive patterns between the conductive pattern used as the source select line SSL and the conductive pattern used as the drain select line DSL among the plurality of conductive patterns 153 may be used as the word line WL.

The channel structure CH and the memory layer 121 may pass through the plurality of conductive patterns 153 and the plurality of first interlayer insulating patterns 113A of the gate stack GST, and may pass through the gate-source insulating layer 103 and the etch stop layer 101, The channel structure CH may have a taper shape that becomes narrower as a distance from the bit line BL increases. The second gap-fill insulating pattern 143E may pass through the gate-source insulating layer 103. The second gap-fill insulating pattern 143B may be in contact with a surface of the etch stop layer 101 facing the second bonding insulating layer 303.

The vertical structure VP may be formed of a vertical insulating layer 157. The vertical insulating layer 157 may extend along the sidewall of the gate stack GST and may pass through the gate-source insulating layer 103. As an embodiment, the vertical insulating layer 157 may be in contact with the surface of the etch stop layer 101 facing the third direction D3. As another embodiment, the vertical insulating layer 157 may pass through the etch stop layer 101 and may be in contact with the doped semiconductor layer 351. The vertical insulating layer 157 may have a taper shape that becomes narrower as a distance from the bit line BL increases.

The conductive peripheral circuit contact PCT may pass through the second gap-fill insulating pattern 143B. The conductive peripheral circuit contact PCT may have a taper shape that becomes narrower as a distance from the second conductive bonding pad 313 increases.

The etch stop layer 101 may be covered with the doped semiconductor layer 351 and an upper insulating layer 353.

The doped semiconductor layer 351 may be in contact with the channel layer 123 of the channel structure CH. The channel layer 123 and the core insulating layer 125 of the channel structure CH may protrude than the memory layer 121 toward the doped semiconductor layer 351, The channel layer 123 may extend along a surface of the core insulating layer 125 facing the doped semiconductor layer 351 to block contact between the core insulating layer 125 and the doped semiconductor layer 351. The doped semiconductor layer 351 may include a conductive impurity. The doped semiconductor layer 351 may include at least one of an n-type impurity and a p-type impurity. As an embodiment, the doped semiconductor layer 351 may be divided into a layer including an n-type impurity and a layer including a p-type impurity.

The upper insulating layer 353 may be disposed at substantially the same level as the doped semiconductor layer 351. The upper insulating layer 353 may be penetrated by a conductive contact plug 100B, The conductive contact plug 100B may be connected to the conductive peripheral circuit contact PCT corresponding thereto.

A process of forming a first circuit structure including the first bonding insulating layer 301, the first conductive bonding pad 311, and configurations disposed thereunder, and a process of forming a second circuit structure including the second bonding insulating layer 303, the second conductive bonding pad 313, configurations disposed thereon may be separately performed. Accordingly, in an embodiment, a phenomenon in which a characteristic of the transistor TR of the first circuit structure is deteriorated due to heat generated while forming the second circuit structure may be improved.

After the first circuit structure and the second circuit structure are separately formed, a bonding process may be performed so that the first bonding insulating layer 301 is bonded to the second bonding insulating layer 303 and the first conductive bonding pad 311 is bonded to the second conductive bonding pad 313, to electrically and structurally connect the memory cell array and the peripheral circuit structure. For example, the channel structure CH may be connected to the transistor TR corresponding thereto via the capping pattern 127, the first contact 183A, the bit line BL, the second conductive bonding pad 313, the first conductive bonding pad 311, and the interconnection IC, In addition, the conductive contact plug 1008 may be connected to the transistor TR corresponding thereto via the conductive peripheral circuit contact PCT, the second contact 183B, the signal transmission line TL, the second conductive bonding pad 313, the first conductive bonding pad 311, and the interconnection IC.

A contact structure between the channel layer 123 and the doped semiconductor layer 351 is not limited to the above-described embodiment.

FIGS. 7A and 7B illustrate a case in which the etch stop layer 101 is formed of an insulating material, but an embodiment of the present disclosure is not limited thereto. As another embodiment, as shown in FIGS. 5A and 5B, the semiconductor memory device may include the etch stop layer 101' formed of a conductive material.

Figure 8:
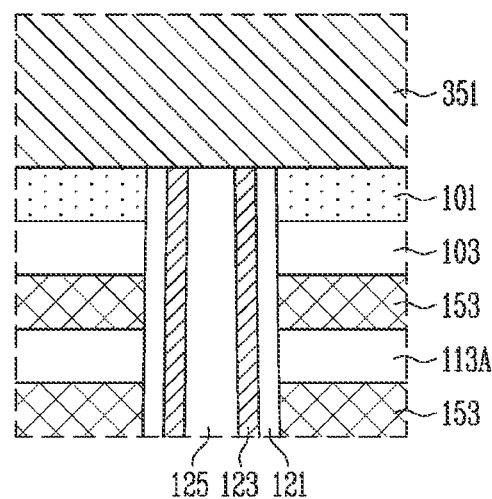
FIG. 8 is a cross-sectional view illustrating an embodiment of a contact structure between a doped semiconductor layer and a channel layer.

FIG. 8 is a cross-sectional view illustrating an embodiment of a contact structure between a doped semiconductor layer and a channel layer. Hereinafter, a repetitive description of the same configurations as those shown in FIG. 7A is omitted.

Referring to FIG. 8, as described above with reference to FIG. 7A, the memory layer 121, the channel layer 123, and the core insulating layer 125 may pass through the conductive pattern 153 and the first interlayer insulating pattern 113A and may extend to pass through the etch stop layer 101 and the gate-source insulating layer 103. Before forming the doped semiconductor layer 351 on the etch stop layer 101, a surface of the memory layer 121, the channel layer 123, and the core insulating layer 125 may be planarized. In this case, the core insulating layer 125 may have a surface that is in contact with the doped semiconductor layer 351. The channel layer 123 may be in contact with the doped semiconductor layer 351 between the core insulating layer 125 and the memory layer 121.

Hereinafter, a method of manufacturing a semiconductor memory device according to an embodiment of the present disclosure is described based on a portion of a manufacturing process of the semiconductor memory device shown in FIGS. 7A and 7B.

Figure 9A:
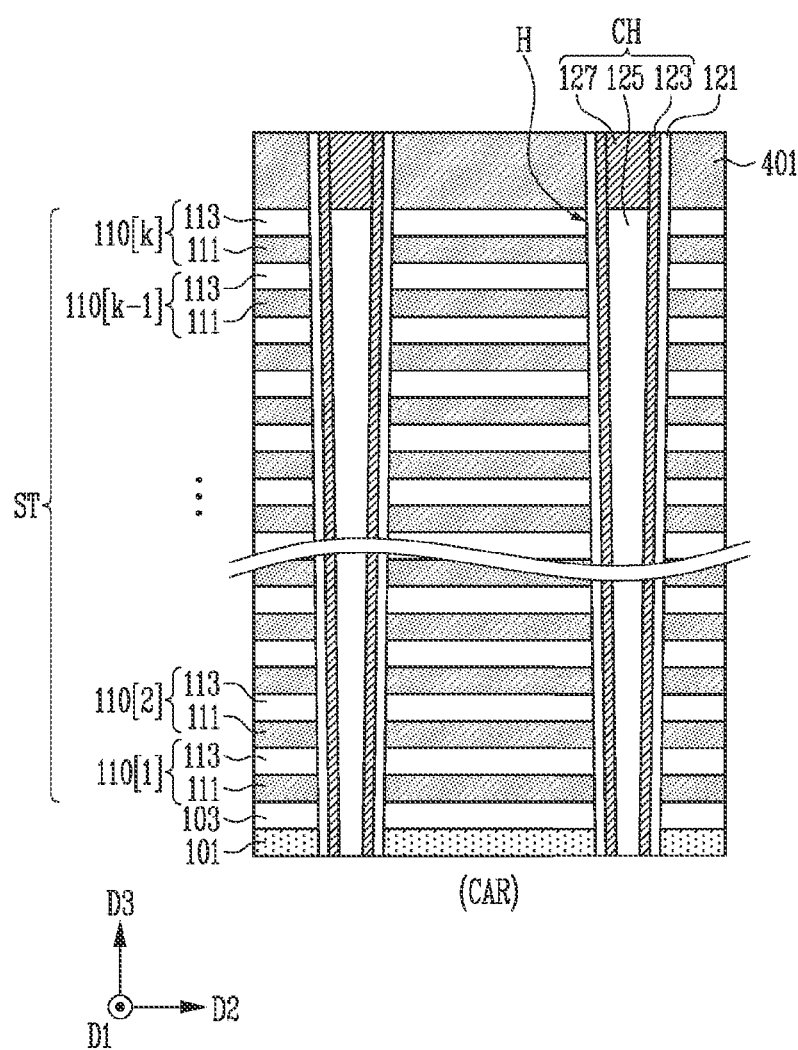
FIGS. 9A, 9B, and 9C are cross-sectional views illustrating a process of forming a cell plug.
Figure 9B:
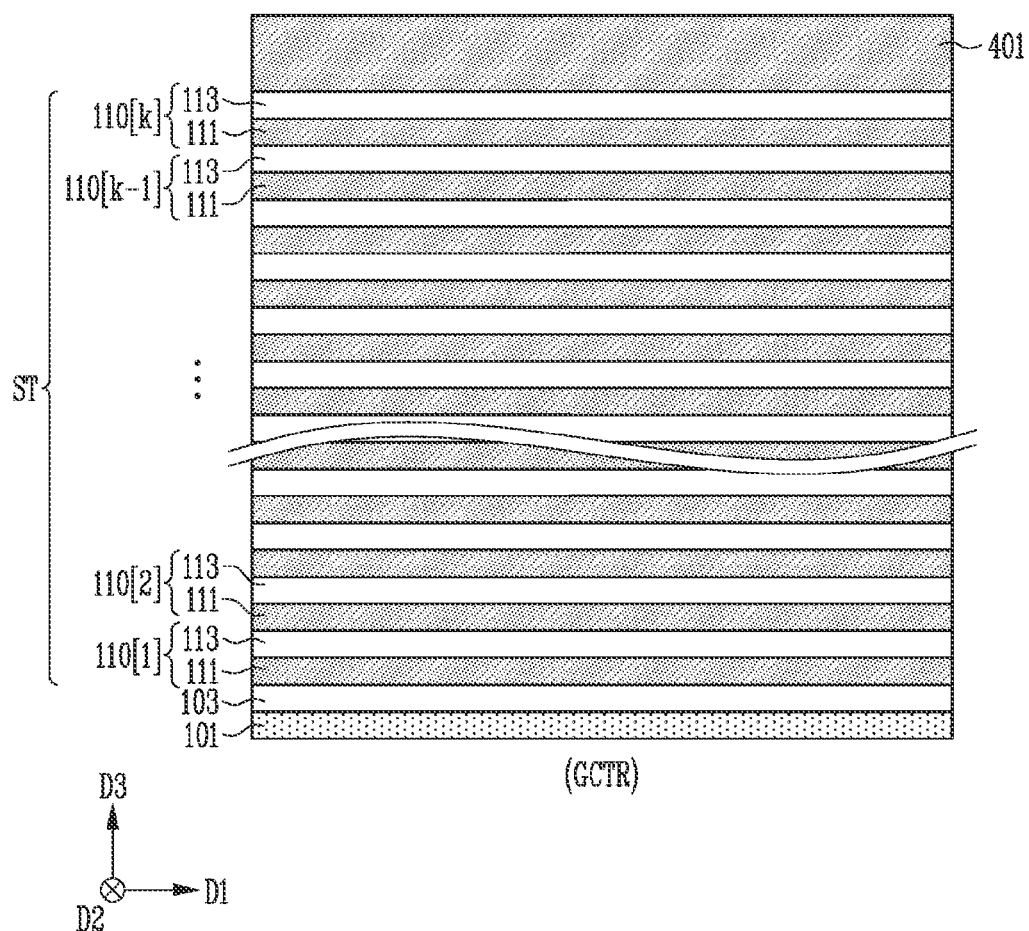
Figure 9C:
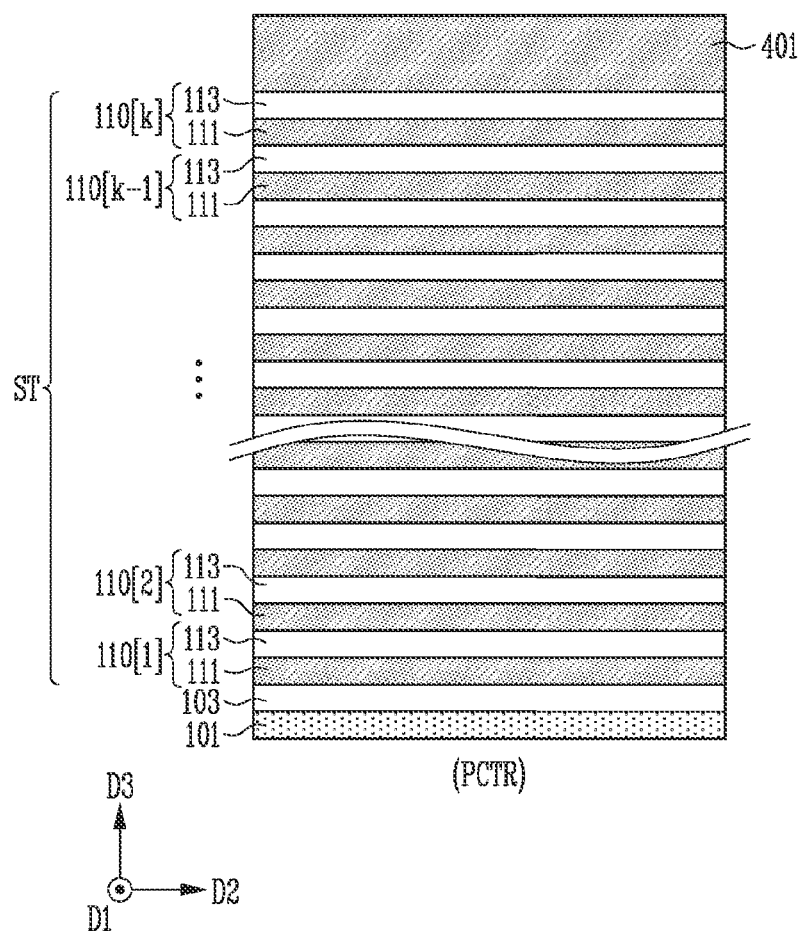

FIGS. 9A, 9B, and 9C are cross-sectional views illustrating a process of forming a cell plug.

Referring to FIGS. 9A to 9C, a gate-source insulating layer 103 may be formed on an etch stop layer 101. Although not shown in the drawings, the etch stop layer 101 may be formed on a lower structure. The lower structure may include a sacrificial substrate. An embodiment of the present disclosure is not limited thereto. For example, the lower structure may include the semiconductor substrate 201, the plurality of transistors TR, the plurality of interconnections IC, the lower insulating structure 221, and the first doped semiconductor layer 231, and the source insulating layer 241 shown in FIGS. 5A and 5B.

After the gate-source insulating layer 103 is formed, a stack ST may be formed on the gate-source insulating layer 103. The stack ST may include a plurality of first material layers (for example, 111) and a plurality of second material layers 113 alternately disposed in the third direction D3. As described with reference to FIGS. 3A to 3C, the etch stop layer 101 may be formed of at least one of silicon nitride, silicon, and silicon carbide (for example, SiCO, and SiCN). Hereinafter, a subsequent process is described using a case in which the etch stop layer 101 is formed of an insulating material such as silicon nitride or silicon carbide as an example.

The plurality of first material layers may be formed of a material having an etch selectivity with respect to the gate-source insulating layer 103 and the plurality of second material layers 113. The plurality of first material layers may be the sacrificial insulating layers 111 described with reference to FIG. 3C, For example, the gate-source insulating layer 103 and the plurality of second material layers 113 may include silicon oxide, and the plurality of first material layers configuring the plurality of sacrificial insulating layers 111 may include silicon nitride. Hereinafter, the plurality of first material layers are referred to as a plurality of sacrificial insulating layers 111.

The stack ST may include a cell array region CAR, a gate contact region GCTR, and a peripheral circuit contact region PCTR, The cell array region CAR, the gate contact region GCTR, and the peripheral circuit contact region PCTR may correspond to the cell array region CAR, the gate contact region GCTR, and the peripheral circuit contact region PCTR described with reference to FIG. 2.

The plurality of sacrificial insulating layers 111 and the plurality of second material layers 113 may configure a plurality of layers 110[1] to 110[k] (k is a natural number greater than 2) stacked in the third direction D3. Each of the plurality of layers 110 [1] to 110 [k] may include a pair of layers, each of the pairs of layers including one sacrificial insulating layer 111 and one second material layer 113 corresponding thereto. For example, the layer 110[1] may include one sacrificial insulating layer 111 and one second material layer 113. The plurality of layers 110 [1] to 110 [k] may be stacked from a first layer 110 [1] disposed on the lowest layer toward the [k]-th layer 110 [k] disposed at the highest layer.

Subsequently, a first mask layer 401 may be formed on the plurality of layers 110 [1] to 110 [k]. The first mask layer 401 may be penetrated by a plurality of holes corresponding to a plurality of channel holes H. The cell array region CAR of the stack ST may be etched through the plurality of holes defined in the first mask layer 401. Accordingly, the plurality of channel holes H may be defined. The plurality of channel holes H may extend to pass through the gate-source insulating layer 103 and the etch stop layer 101.

Subsequently, a memory layer 121 may be formed on a sidewall of each channel hole H. The memory layer 121 may include the blocking insulating layer, the data storage layer, and the tunnel insulating layer as described with reference to FIG. 3A. Thereafter, a central region of the channel hole H may be filled with a channel structure CH. As an embodiment, a forming of the channel structure CH may include forming a channel layer 123 on the memory layer 121, filling a portion of the central region of the channel hole H opened by the channel layer 123 with a core insulating layer 125, and filling another portion of the central region of the channel hole H with a capping pattern 127. The channel layer 123 may be formed of a semiconductor material such as silicon, and the capping pattern 127 may be formed of a doped semiconductor material such as n-type doped silicon. An impurity inside the capping pattern 127 may be diffused into a partial region of the channel layer 123 that is in contact with the capping pattern 127.

Figure 10A:
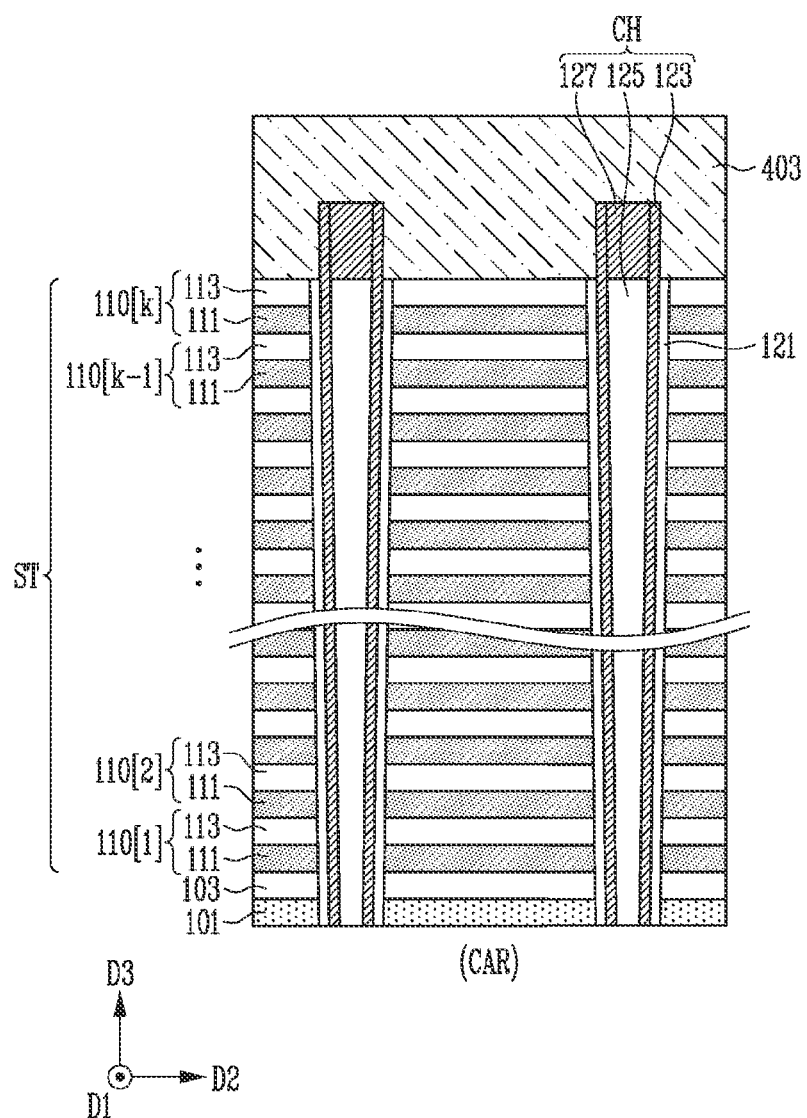
FIGS. 10A, 10B, and 10C are cross-sectional views illustrating a process of forming a step-shaped side tall.
Figure 10B:
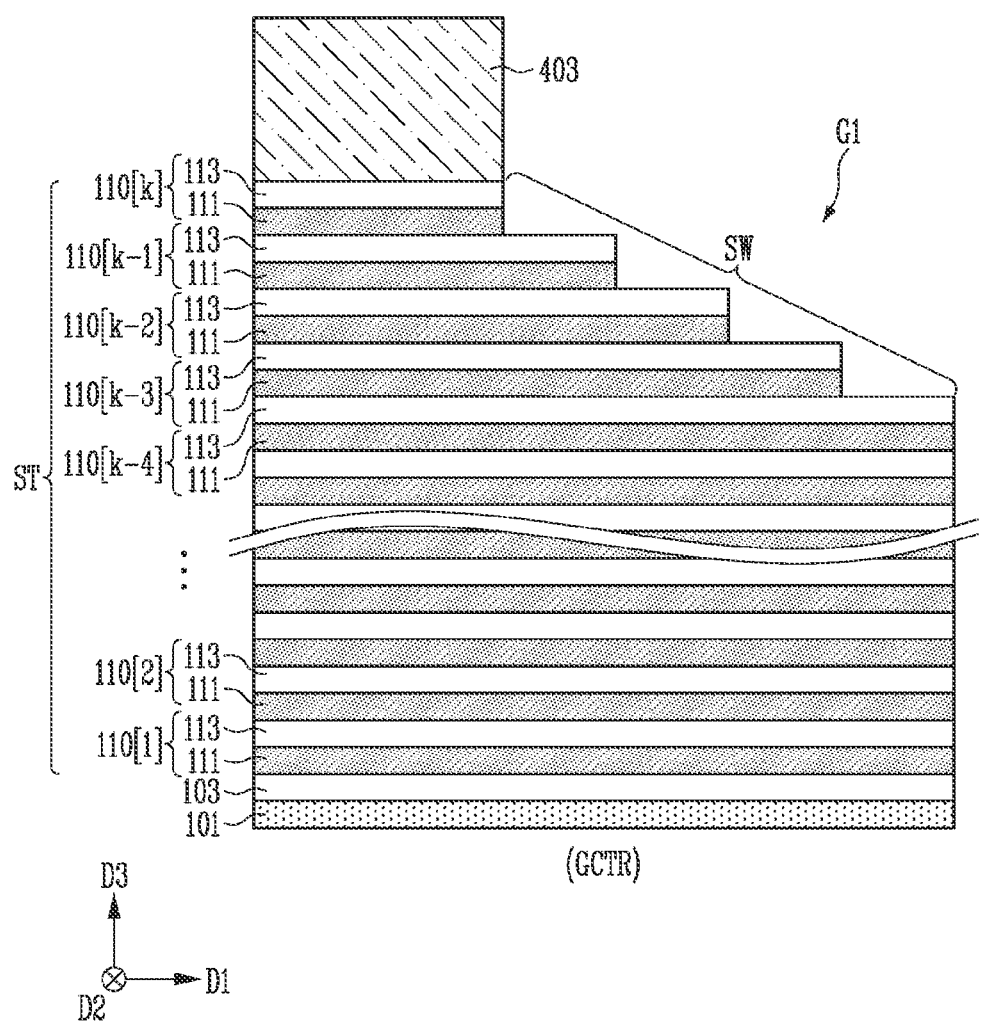
Figure 10C:
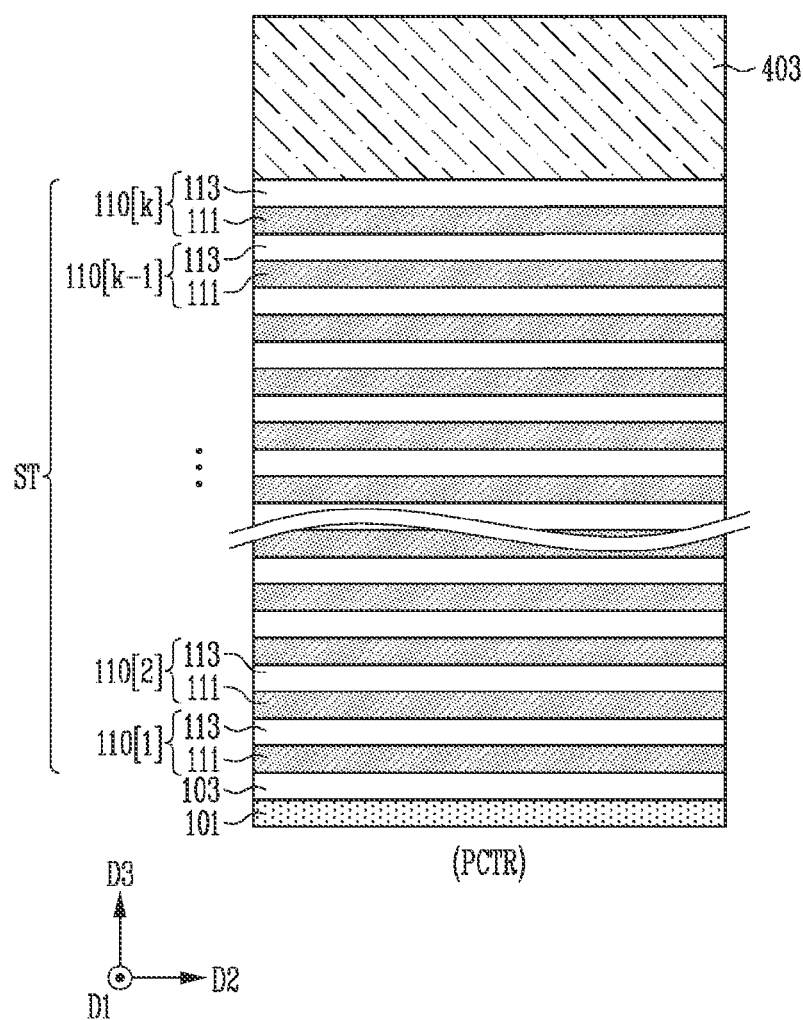

FIGS. 10A, 10B, and 10C are cross-sectional views illustrating a process of forming the step-shaped sidewall SW.

Referring to FIGS. 10A to 10C, the first mask layer 401 shown in FIGS. 9A to 9C may be removed. At this time, a portion of the memory layer 121 may be removed. As the first mask layer 401 is removed, an end of the channel structure CH protruded in the third direction D3 than the stack ST may be exposed.

Figure 11A:
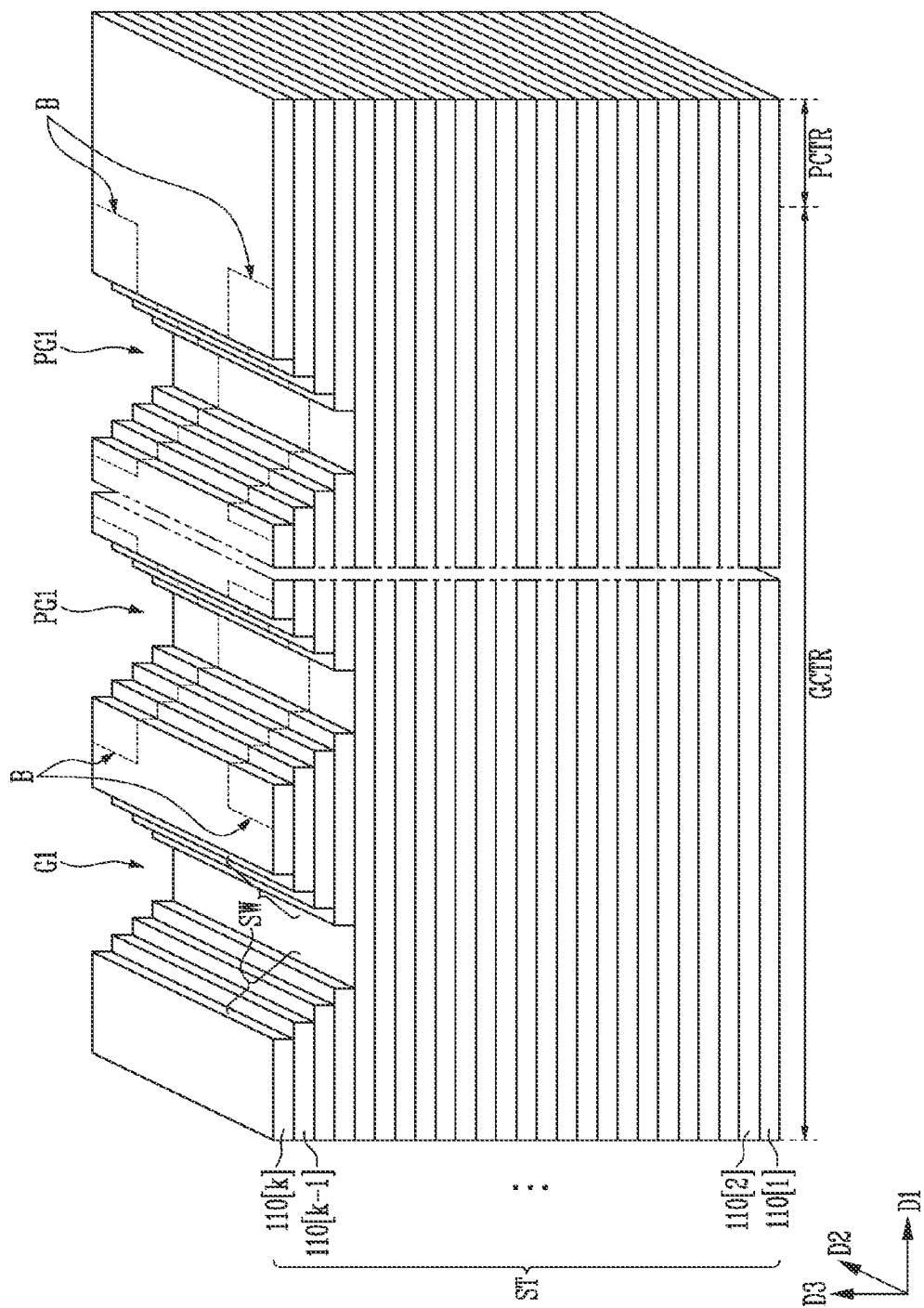
FIGS. 11A and 11B are diagrams illustrating a first step-shaped groove and a plurality of first preliminary step-shaped grooves.
Figure 11B:
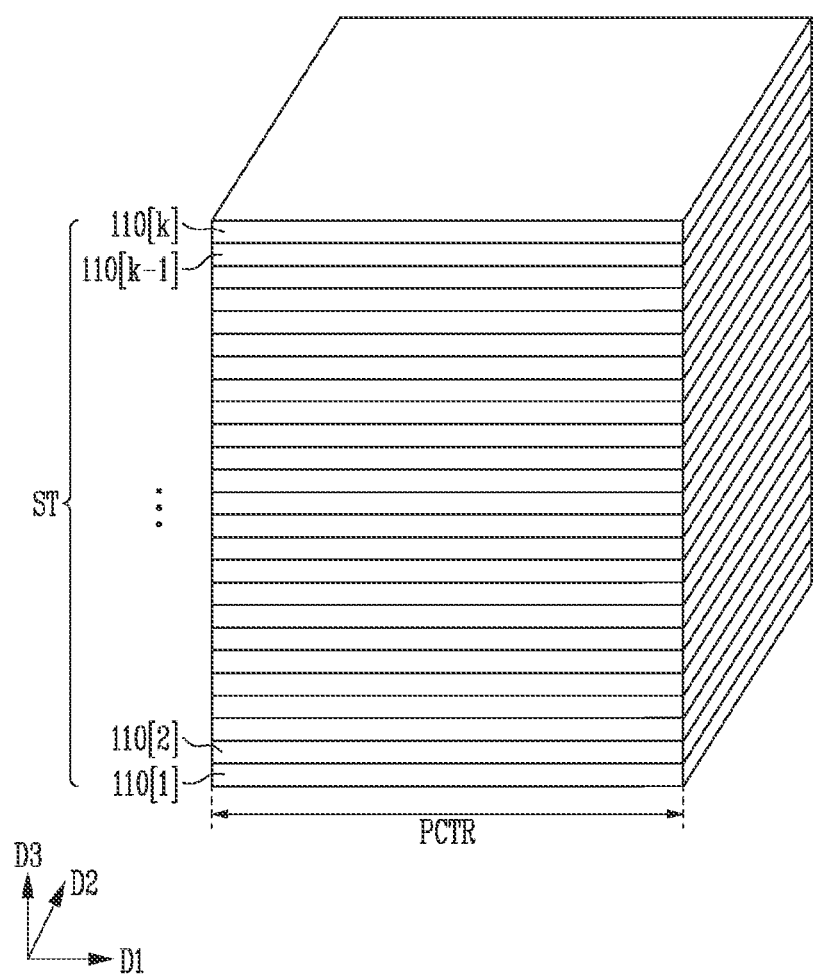

Subsequently, a second mask layer 403 may be formed on the stack ST so that the channel structure CH is covered. The second mask layer 403 may be etched using a photolithography process so that the gate contact region GCTR of the stack ST is exposed. Thereafter, the [k]-th layer 110[k] among the plurality of layers 110[1] to 110[k] of the stack ST may be etched by an etching process using the second mask layer 403 as an etching barrier. Subsequently, by reducing a size of the second mask layer 403, the [k]-th layer 110[k] and a [k−1]-th layer 110[k−1] may be exposed. Thereafter, an exposed region of the [k]-th layer 110[k] and the [k−1]-th layer 110[k−1] may be etched by an etching process using the second mask layer 403 of which the size is reduced as an etching barrier. Until a targeted layer is exposed, a process of reducing the size of the second mask layer 403 and the etching process of the stack ST may be repeated. As an embodiment, until a [k−4]-th layer 100 [k−4] of the stack ST is exposed, the process of reducing the size of the second mask layer 403 and the etching process of the stack ST may be repeated. Accordingly, a first step-shaped groove G1 having a step-shaped sidewall SW may be formed, FIGS. 11A and 11B are diagrams illustrating the first step-shaped groove G1 and a plurality of first preliminary step-shaped grooves PG1.

The second mask layer 403 shown in FIGS. 10A to 10C may be removed after forming the targeted first step-shaped groove G1. The plurality of first preliminary step-shaped grooves PG1 may be formed in the gate contact region GCTR of the stack ST while the first step-shaped groove G1 is formed. The plurality of first preliminary step-shaped grooves PG1 may be formed at a first depth the same as the first step-shaped groove G1. As an embodiment, each of the first step-shaped groove G1 and the plurality of first preliminary step-shaped grooves PG1 may have the bottom surface defined by the [k−4]-th layer 110 [k−4], and the step-shaped sidewall SW defined by the [k−3]-th layer 110[k−3], the [k−2]-th layer 110[k−2], the [k−1]-th layer 110[k−1], and the [k]-th layer 110[k]. The first step-shaped groove G1 and the plurality of first preliminary step-shaped grooves PG1 may be disposed to be spaced apart from each other.

During an etching process for forming the first step-shaped groove G1 and the plurality of first preliminary step-shaped grooves PG1, the peripheral circuit contact region PCTR of the stack ST may be protected by the second mask layer 403 shown in FIGS. 10A to 10C.

Figure 12A:
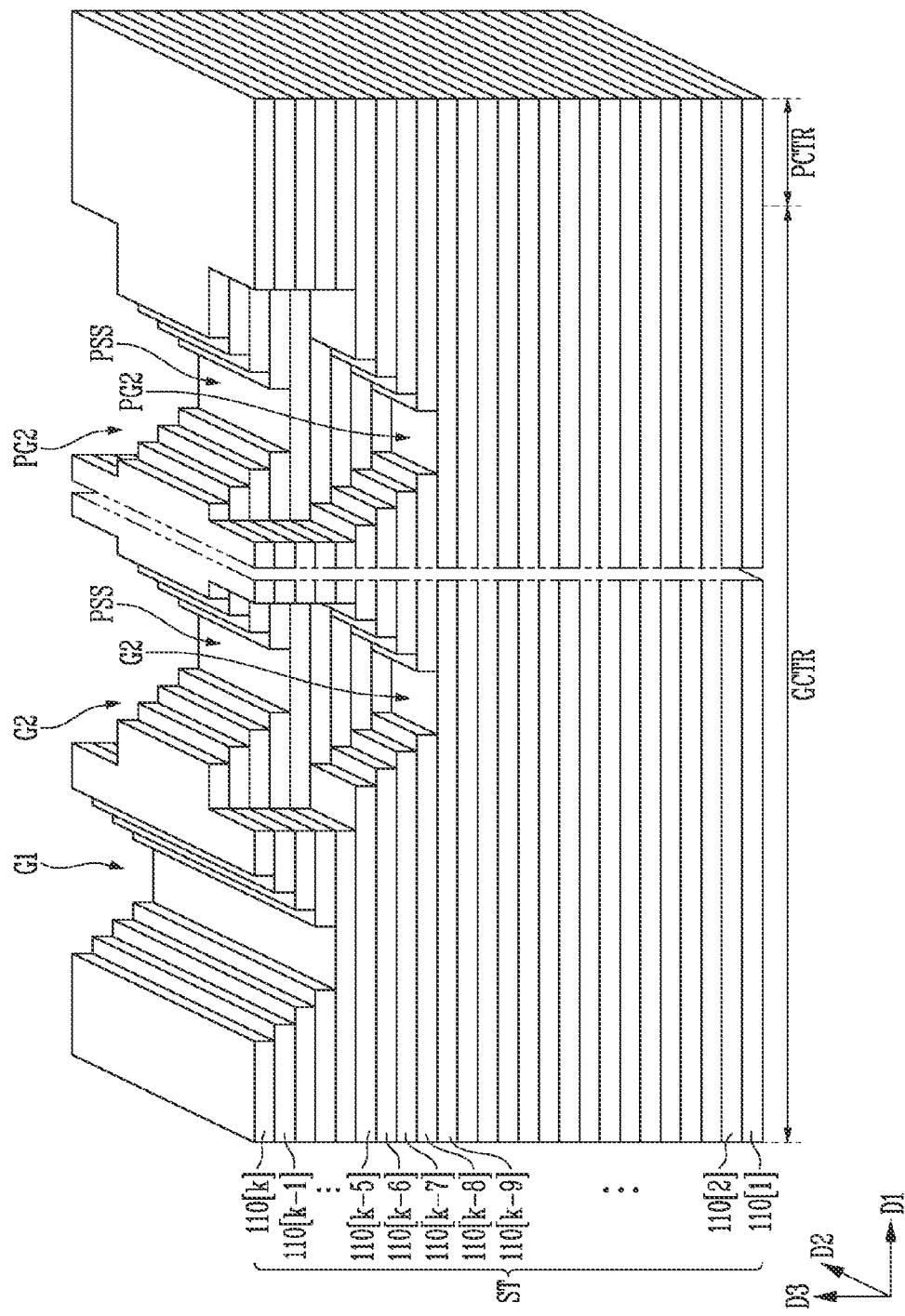
FIGS. 12A and 12B are diagrams illustrating a process of forming a second step-shaped groove and a plurality of second preliminary step-shaped grooves.
Figure 12B:
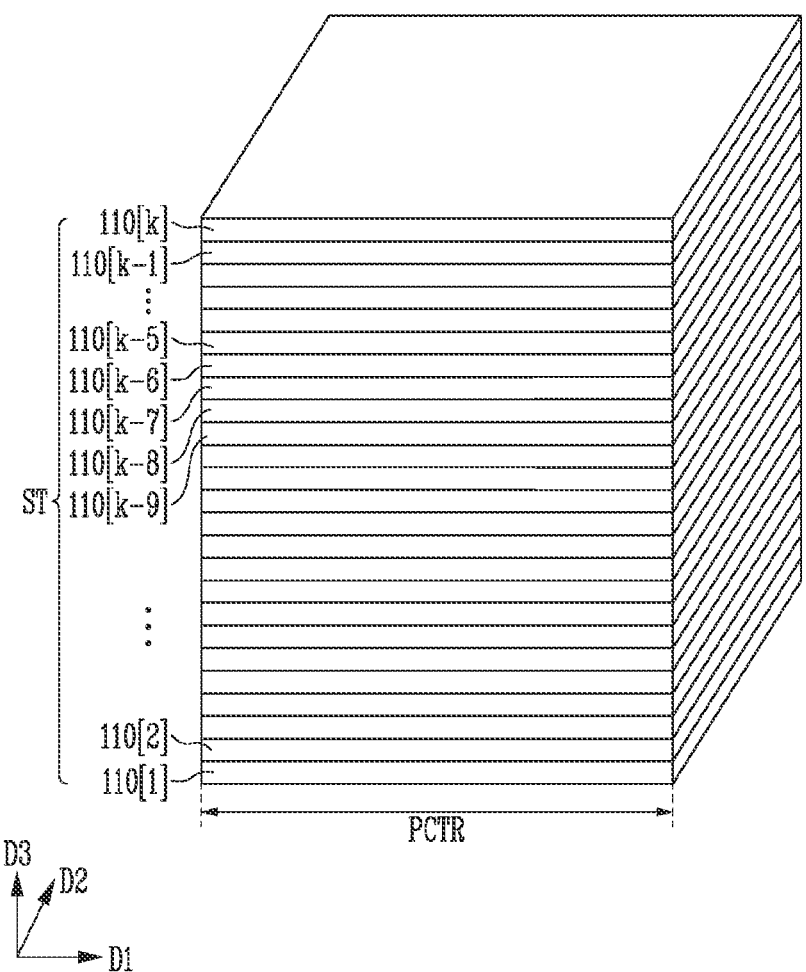

FIGS. 12A and 12B are diagrams illustrating a process of forming a second step-shaped groove G2 and a plurality of second preliminary step-shaped grooves PG2.

Referring to FIGS. 12A and 12B, after a third mask layer (not shown) is formed, a plurality of box regions B of the plurality of first preliminary step-shaped grooves PG1 shown in FIG. 11A may be etched by an etching process using the third mask layer as an etching barrier. Accordingly, the plurality of box regions B of the plurality of first preliminary step-shaped grooves PG1 shown in FIG. 11A may be moved to a second depth greater than the first depth. Accordingly, the second step-shaped groove G2 and the plurality of second preliminary step-shaped grooves PG2 having the second depth may be formed. As an embodiment, each of the second step-shaped groove G2 and the plurality of second preliminary step-shaped grooves PG2 may have a bottom surface defined by a [k−9]-th layer 110[k−9] and, a step-shaped sidewall defined by a [k−8]-th layer 110[k−8], a [k−7]-th layer 110[k−7], a [k−6]-th layer 110[k−6], and a [k−5]-th layer 110[k−5].

A partial region of the plurality of first preliminary step-shaped grooves PG1 protected by the third mask layer may remain as a plurality of protrusion step-shaped structures PSS. During an etching process for forming the second step-shaped groove G2 and the plurality of second preliminary step-shaped grooves PG2, the peripheral circuit contact region PCTR of the stack ST may be protected by the third mask layer. The third mask layer may be removed after the second step-shaped groove G2 and the plurality of second preliminary step-shaped grooves PG2 are formed.

Thereafter, a vertical etching process for moving the second preliminary step-shaped grooves PG2 to a depth greater than the second depth may be performed. The second preliminary step-shaped grooves PG2 may be moved to targeted different depths by the vertical etching process.

Figure 13A:
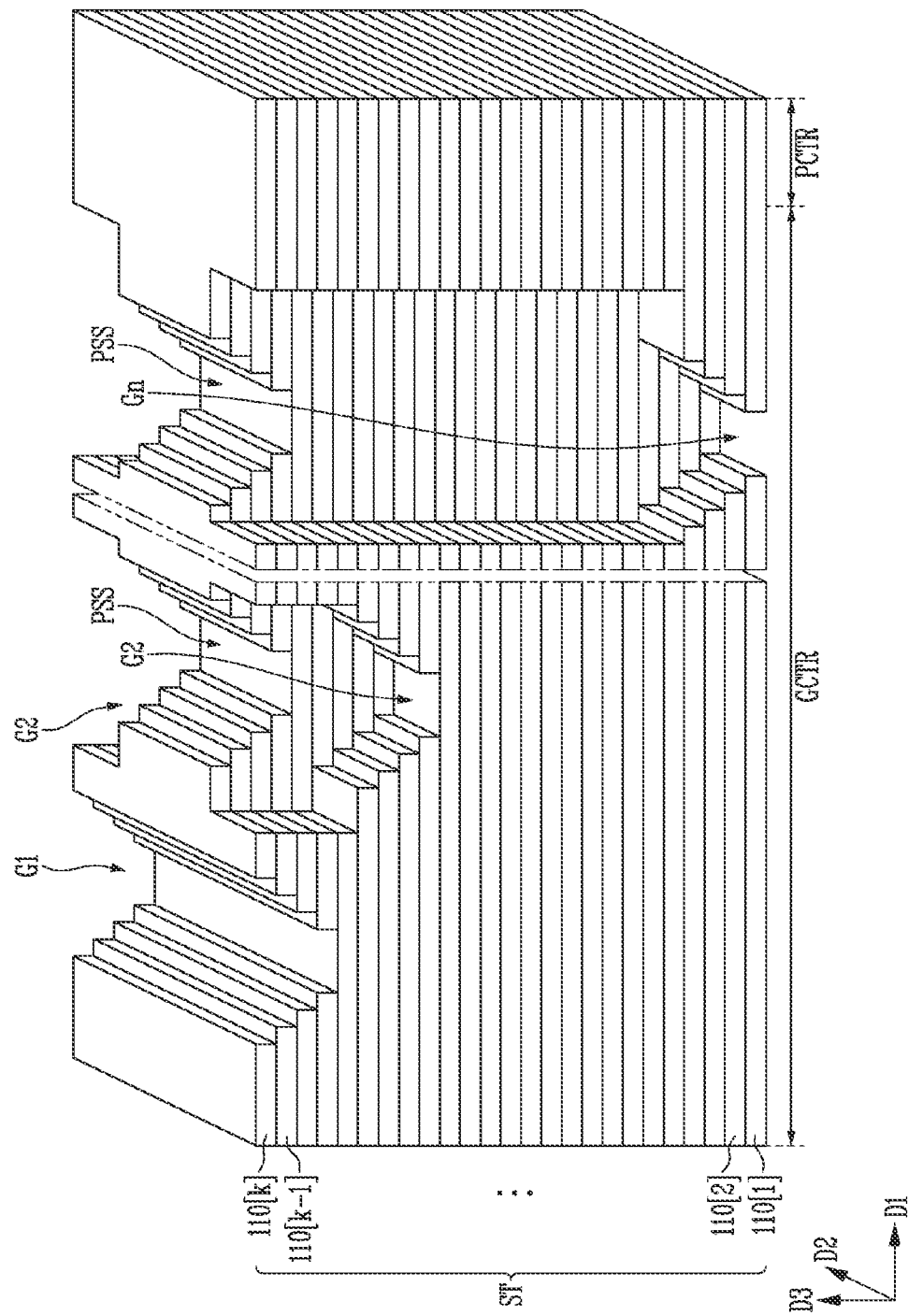
FIGS. 13A and 13B are diagrams illustrating a vertical etching process.
Figure 13B:
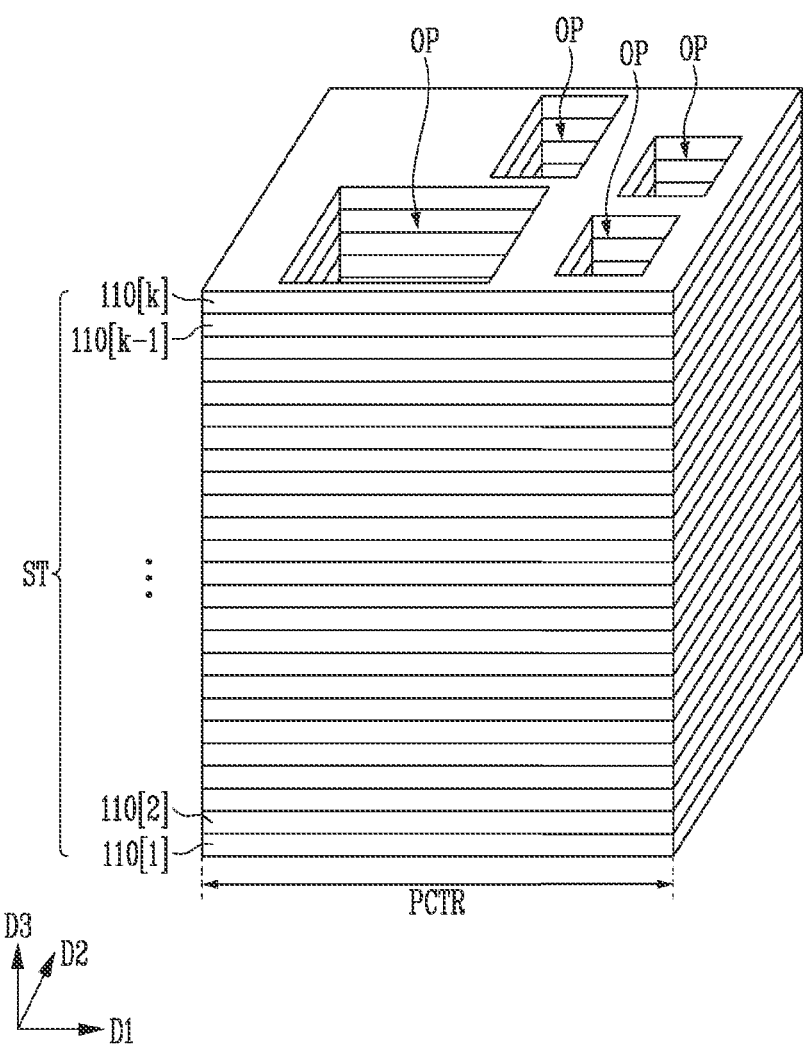

FIGS. 13A and 13B are diagrams illustrating the vertical etching process. FIGS. 13A and 138 illustrate a vertical etching process for forming the deepest n-th step-shaped groove Gn among the plurality of step-shaped grooves G1 to Gn shown in FIG. 2.

Referring to FIGS. 13A and 13B, at least one of the second preliminary step-shaped grooves PG2 may move to the depth at which the first layer 110[1] is disposed which is disposed at the lowest layer, by a vertical etching process using a fourth mask layer (not shown) as an etching barrier. Accordingly, an n-th step-shaped groove Gn may be formed.

According to the above-described process, the n-th step-shaped groove Gn may be defined as at least one of the plurality of box regions B shown in FIG. 11A is moved to the depth at which the first layer 110[1] is disposed.

During the vertical etching process for forming the n-th step-shaped groove Gn, the peripheral circuit contact region PCTR of the stack ST may be etched, and thus a plurality of openings OP may be defined. The fourth mask layer may be formed to open a partial region of the peripheral circuit contact region PCTR. The vertical etching process may be performed so that the first layer 110[1] is penetrated in the peripheral circuit contact region PCTR, In order to form the plurality of openings OP using the vertical etching process for forming the n-th step-shaped groove Gn, the fourth mask layer may be defined to partially open the peripheral circuit contact region PCTR of the stack ST.

After the n-th step-shaped groove Gn and the plurality of openings OP are formed, the fourth mask layer may be removed. During the vertical etching process for forming the n-th step-shaped groove Gn and the plurality of openings OP, the gate-source insulating layer 103 shown in FIGS. 10A to 10C may be etched. The etch stop layer 101 shown in FIGS. 10A to 10C might not be penetrated by the n-th step-shaped groove Gn and the plurality of openings OP, and may remain to define bottom surfaces of each of the n-th step-shaped groove Gn and the plurality of openings OP.

Figure 14A:
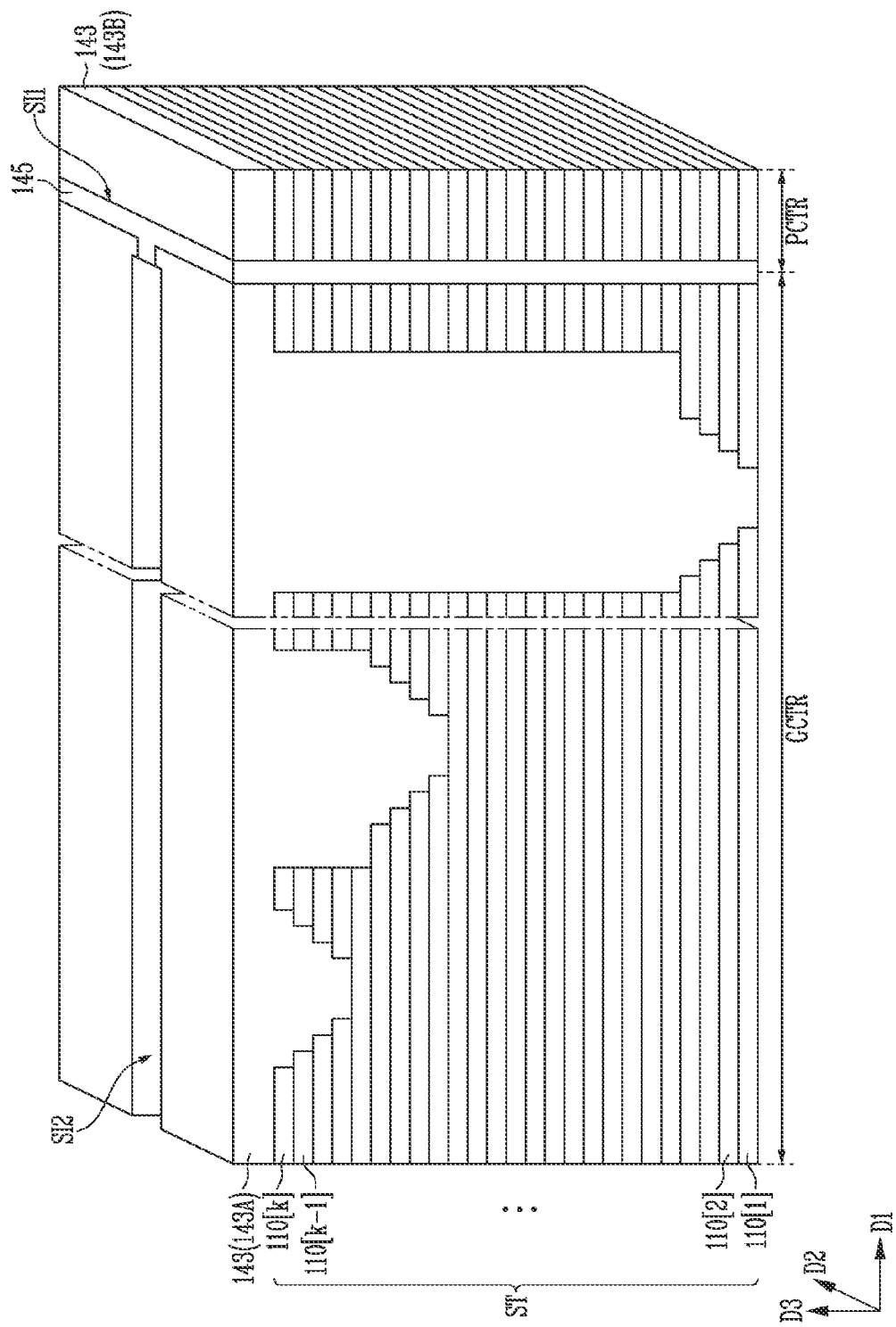
FIGS. 14A and 14B are diagrams illustrating a process of forming a gap-fill insulating layer, a process of forming a first slit, a process of forming a slit insulating layer, and a process of forming a second slit.
Figure 14B:
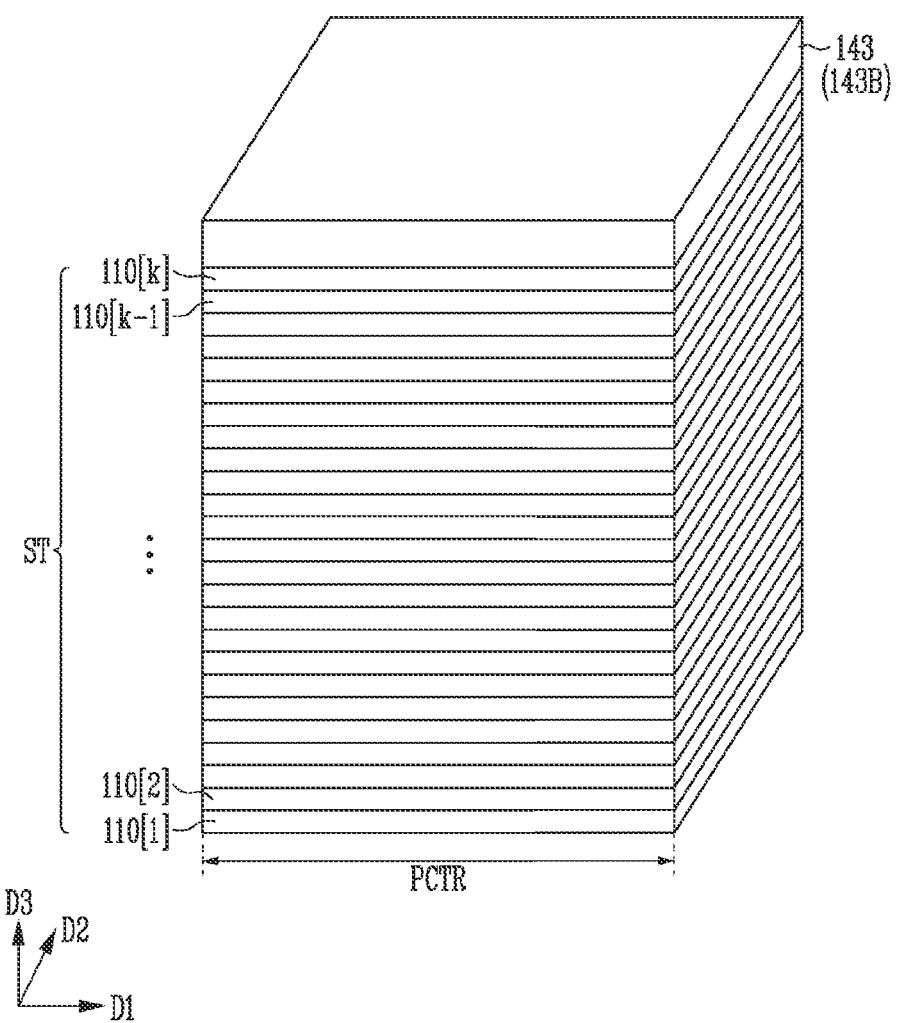

FIGS. 14A and 14B are diagrams illustrating a process of forming a gap-fill insulating layer 143, a process of forming a first slit SI1, a process of forming a slit insulating layer 145, and a process of forming a second slit SI2.

Referring to FIGS. 14A and 14B, the plurality of step-shaped grooves G1 to Gn and the plurality of openings OP shown in FIGS. 13A and 133 may be filled with the gap-fill insulating layer 143. The plurality of protrusion step-shaped structures PSS shown in FIGS. 13A and 133 may be covered with the gap-fill insulating layer 143.

According to an embodiment of the present disclosure, as shown in FIGS. 13A and 13B, by disposing the plurality of openings OP to be spaced apart from each other in the dummy stack DMST, surface flatness of the gap-fill insulating layer 143 may be improved as described above with reference to FIG. 2.

Figure 15A:
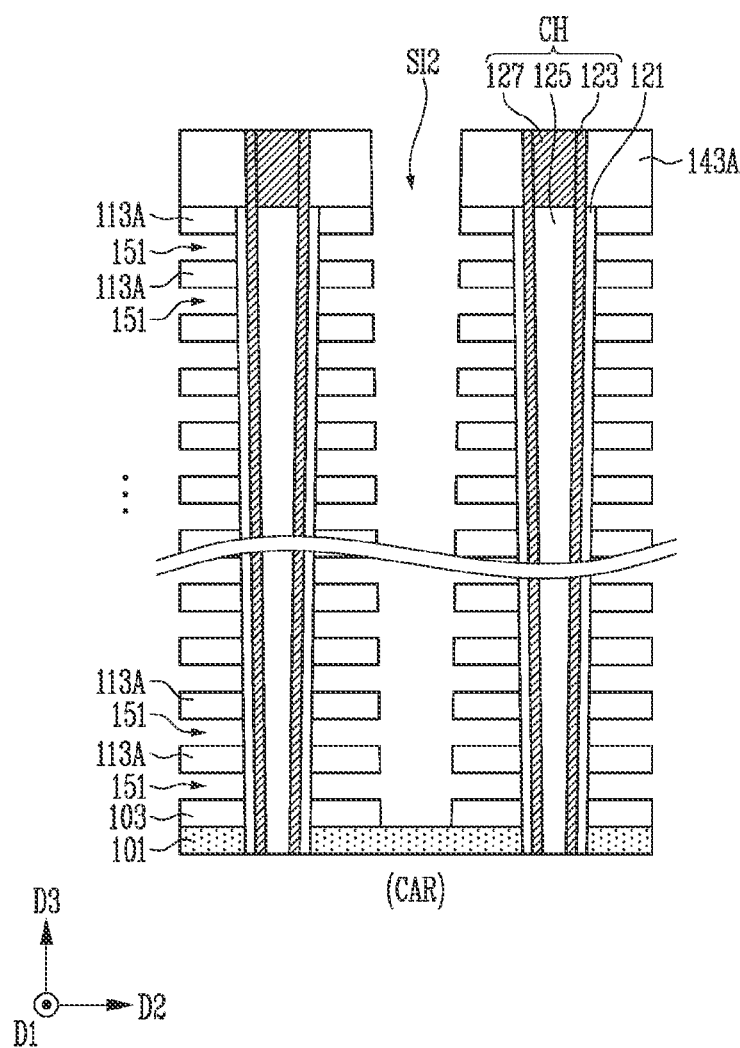
Figure 15B:
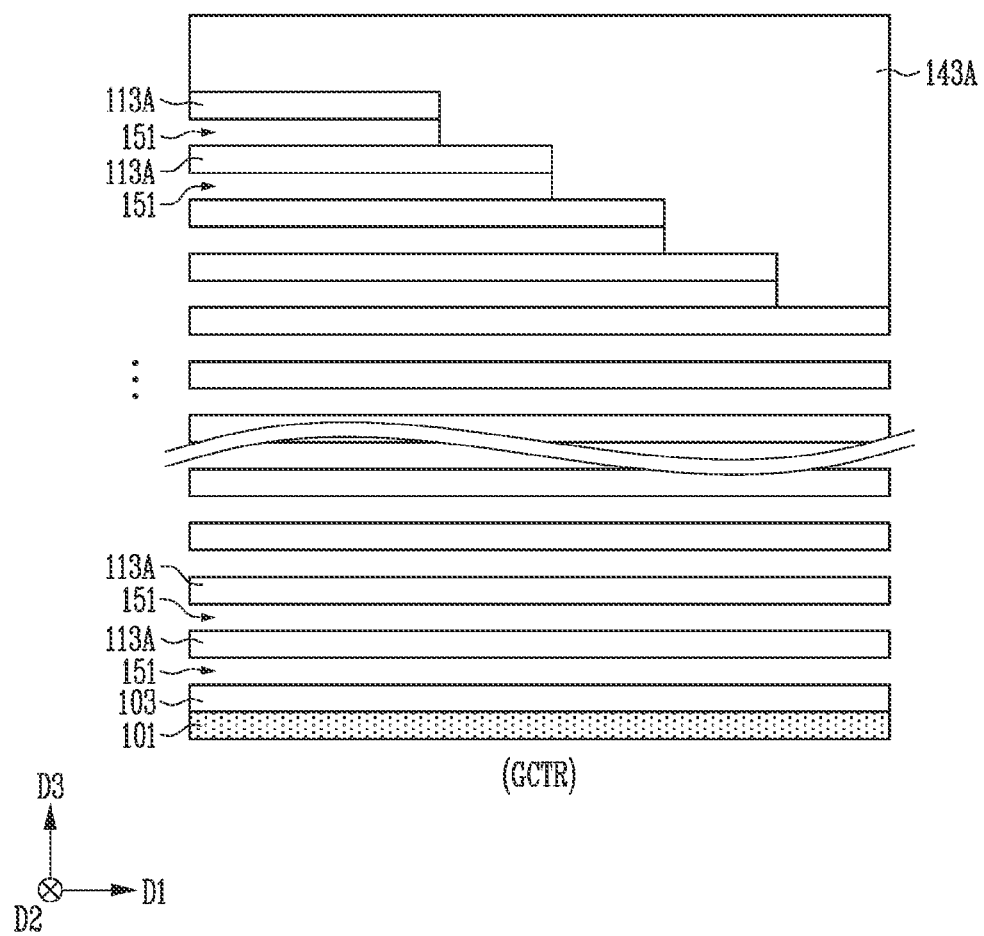

Subsequently, the first slit SI1 passing through the gap-fill insulating layer 143 and the stack ST may be formed. The first slit SI1 may pass through the stack ST between the step-shaped contact region GCTR and the peripheral circuit contact region PCTR. The gap-fill insulating layer 143 may be separated into a first gap-fill insulating pattern 143A and a second gap-fill insulating pattern 1433 by the first slit SI1, The first gap-fill insulating pattern 143A may overlap the gate contact region GCTR of the stack ST and the second gap-fill insulating pattern 1438 may overlap the peripheral circuit contact region PCTR of the stack ST. The plurality of second material layers may be separated into a plurality of first interlayer insulating patterns 113A and a plurality of second interlayer insulating patterns 1138 by the first slit SU as shown in FIGS. 15A to 15C. The plurality of first interlayer insulating patterns 113A may be disposed in the cell array region CAR and the gate contact region GCTR of the stack ST, and the plurality of second interlayer insulating patterns 113B may be disposed in the peripheral circuit contact region PCTR of stack ST.

Thereafter, the first slit SI1 may be filled with the slit insulating layer 145.

Subsequently, the second slit 512 passing through the cell array region CAR of the stack ST may be formed. The second slit SI2 may extend toward the slit insulating layer 145 and expose a sidewall of the slit insulating layer 145. The second slit 512 may intersect the plurality of protrusion step-shaped structures PSS shown in FIGS. 13A and 138.

FIGS. 15A, 158, 15C, 16A, 16B, and 16C are diagrams illustrating a process of forming a plurality of conductive patterns.

Referring to FIGS. 15A to 15C, the plurality of sacrificial insulating layers 111 shown in FIGS. 10A and 10B may be removed through the second slit 512 described with reference to FIGS. 14A and 14B. At this time, the slit insulating layer 145 may protect a portion of the plurality of sacrificial insulating layers 111 formed in the peripheral circuit contact region PCTR of the stack ST shown in FIGS. 14A and 14B. Accordingly, the portion of the plurality of sacrificial insulating layers 111 formed in the peripheral circuit contact region PCTR of the stack ST may remain to form the dummy stack DMST. Another portion of the plurality of sacrificial insulating layers 111 formed in the cell array region CAR and the gate contact region GCTR of the stack ST may be removed. Accordingly, a plurality of horizontal spaces 151 may be opened. The plurality of horizontal spaces 151 may be defined between the first interlayer insulating patterns 113A adjacent in the third direction D3, and between the gate-source iinsulating layer 103 and the first interlayer insulating patterns 113A adjacent in the third direction D3.

Figure 16A:
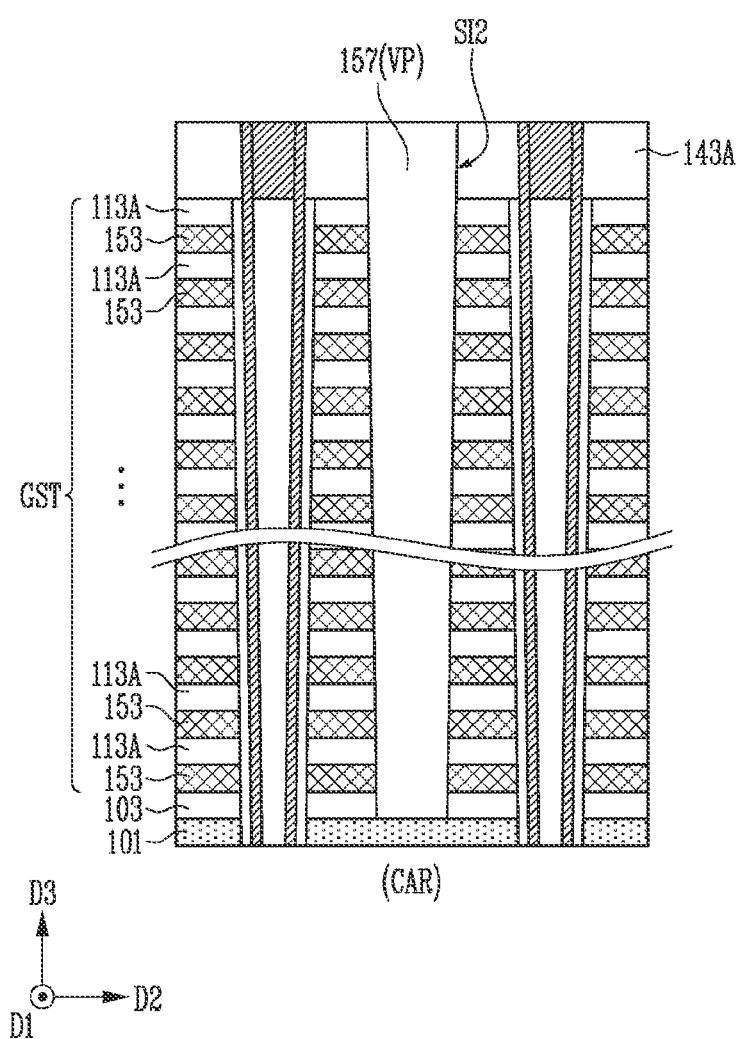
Figure 16B:
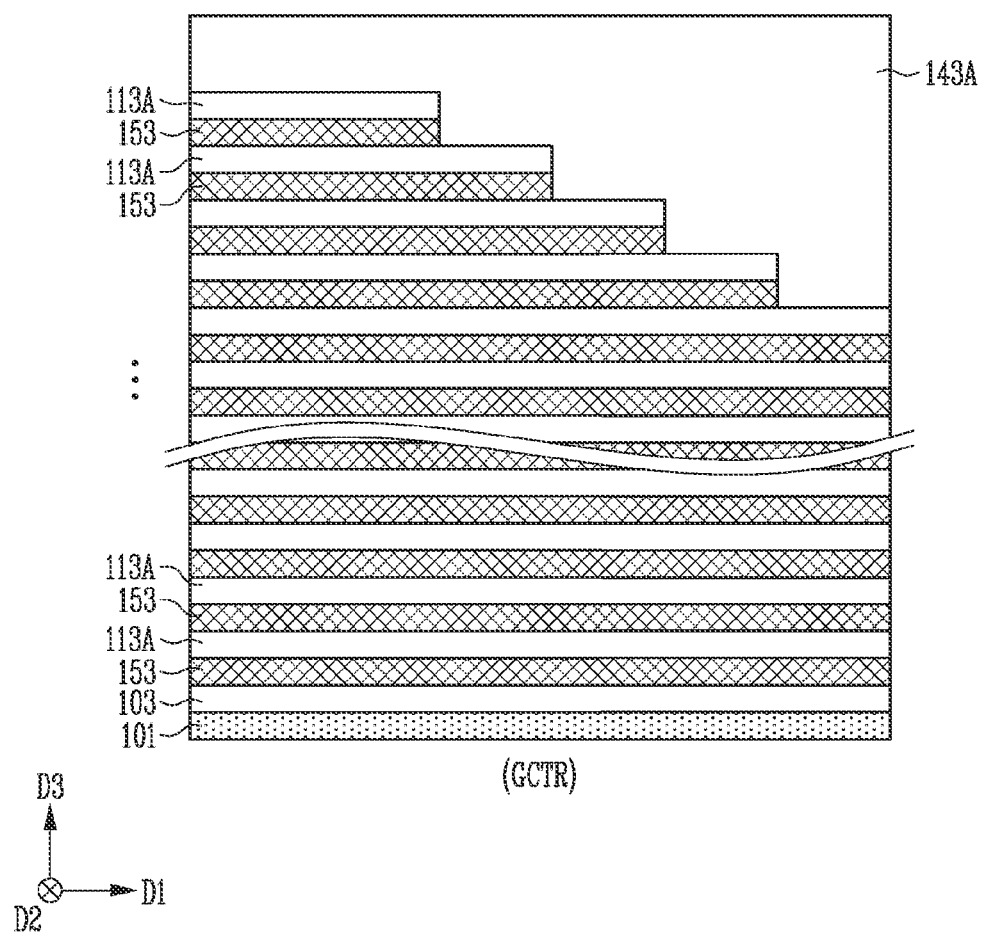
Figure 16C:
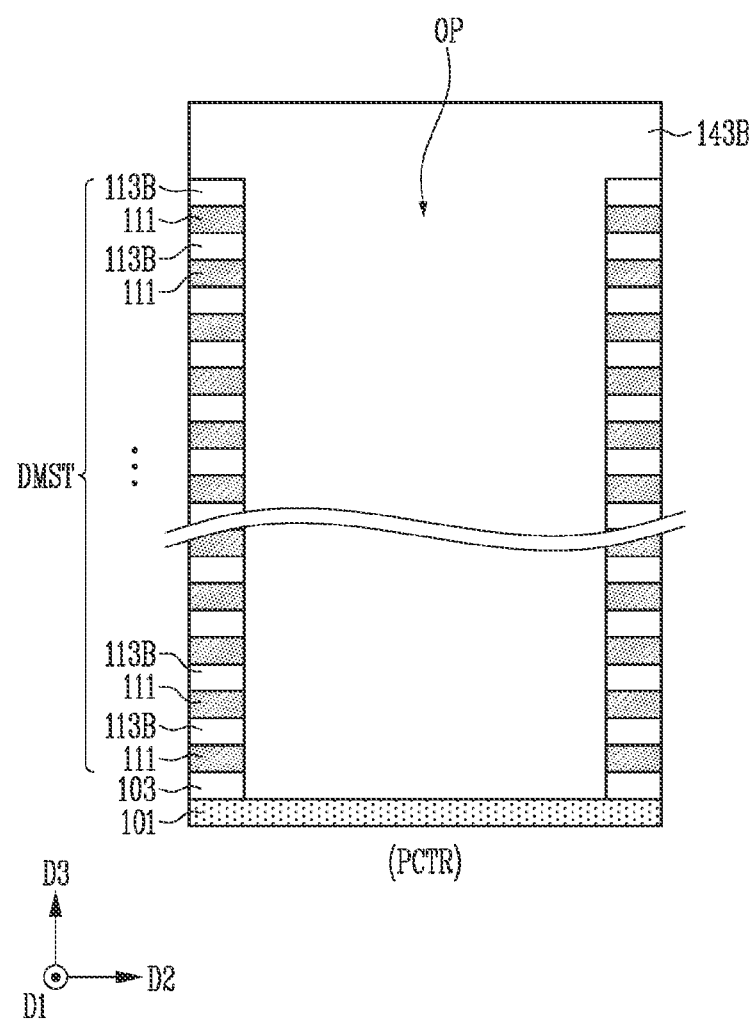

Referring to FIGS. 16A to 16C, the plurality of horizontal spaces 151 shown in FIGS. 15A and 15B may be filled with a plurality of conductive patterns 153. Accordingly, a gate stack GST may be formed. According to an embodiment of the present disclosure, while a portion of the plurality of sacrificial insulating layers 111 is replaced with the plurality of conductive patterns 153 in the cell array region CAR and the gate contact region GCTR, a portion of the plurality of sacrificial insulating layers 111 may remain to form the dummy stack DMST in the peripheral circuit contact region PCTR.

After forming the plurality of conductive patterns 153, the second slit SI2 may be filled with an insulating material. Accordingly, a vertical structure VP including a vertical insulating layer 157 may be formed. A process of forming the vertical structure VP is not limited thereto. For example, in order to form the vertical structure VP shown in FIG. 5A, the following processes may be performed.

Referring to FIG. 5A, forming the vertical structure VP shown in FIG. 5A may include forming the spacer insulating layer 155 on the sidewall of the gate passing through portion SI2A of the second slit SI2, forming the extension portion SI2B of the second slit SI2 passing through the etch stop layer 101', and forming the vertical contact structure 159. The vertical contact structure 159 may be formed to fill the extension portion SI2B of the second slit SI2 and to extend along the surface of the spacer insulating layer 155. Before forming the conductive vertical contact structure 159, the second doped semiconductor layer 233 that is in contact with the channel layer 123 through the second slit 512 may be formed.

As described above, after forming the vertical structure VP according to various embodiments, as shown in FIGS. 2 and 36, the plurality of conductive gate contacts GCT may be formed in the plurality of step-shaped grooves G1 to Gn. The plurality of conductive gate contacts GCT may pass through the first gap-fill insulating pattern 143A, In addition, as shown in FIGS. 2 and 3C, the plurality of conductive peripheral circuit contacts PCT may be formed in the plurality of openings OP. The plurality of conductive peripheral circuit contacts PCT may pass through the second gap-fill insulating pattern 1436.

The plurality of conductive gate contacts GCT and the plurality of conductive peripheral circuit contacts PCT may be formed using the same mask process. As an embodiment, referring to FIGS. 2, 3B and 3C, a mask layer (not shown) having a plurality of openings may be formed on the first gap-fill insulating pattern 143A and the second gap-fill insulating pattern 1436. Thereafter, a plurality of contact holes passing through the first gap-fill insulating pattern 143A and the second gap-fill insulating pattern 1436 may be formed by etching the gap-fill insulating layer 143 in an etching process using the mask layer as an etch barrier. The plurality of contact holes may include a plurality of first contact holes disposed in the cell array region CAR and a plurality of second contact holes disposed in the peripheral circuit contact region PCTR. Each of the first contact holes may pass through the first interlayer insulating pattern 113A corresponding thereto. Because the etch stop layer 101 has an etch resistance to an etching material of the gap-fill insulating layer 143, the etch stop layer 101 might not be penetrated by the second contact hole and may define a bottom surface of the second contact hole, Subsequently, a conductive material may be formed in each of the plurality of first contact holes and the plurality of second contact holes, and the mask layer may be removed. Accordingly, the plurality of conductive gate contacts GCT and the plurality of conductive peripheral circuit contacts PCT may be formed.

Figure 17:
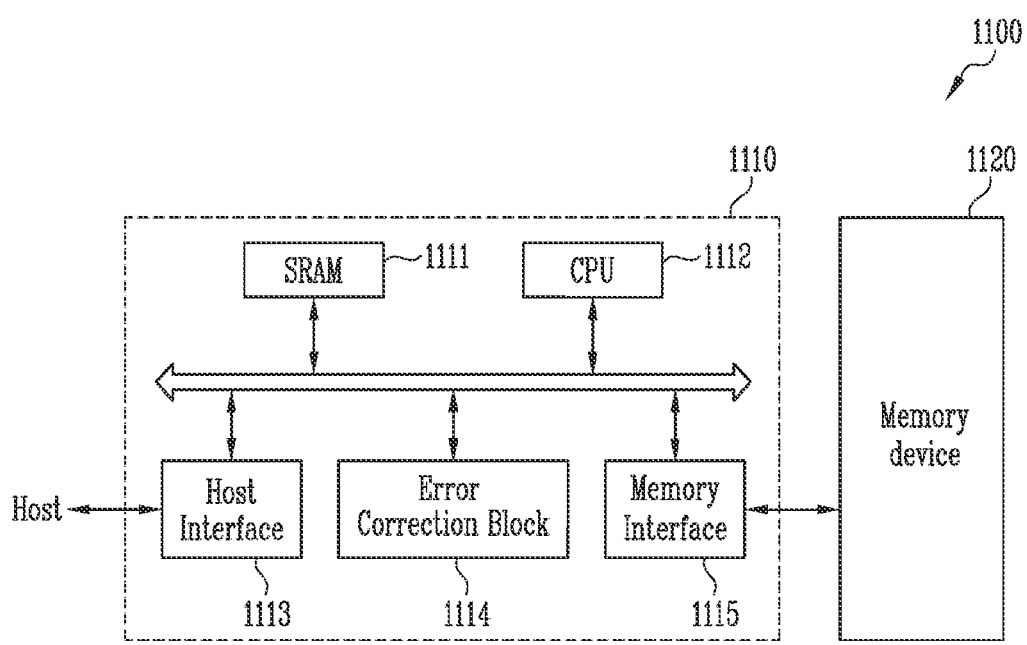
FIG. 17 is a block diagram illustrating a configuration of a memory system according to an embodiment of the present disclosure.

FIG. 17 is a block diagram illustrating a configuration of a memory system according to an embodiment of the present disclosure.

Referring to FIG. 17, the memory system 1100 includes a memory device 1120 and a memory controller 1110.

The memory device 1120 may be a multi-chip package configured of a plurality of flash memory chips. The memory device 1120 may include the gate stack, the dummy stack, the plurality of step-shaped grooves defined at different depths in the gate contact region of the gate stack, the plurality of openings passing through the dummy stack and spaced apart from each other, the gap-fill insulating layer filling the plurality of step-shaped grooves and the plurality of openings, the plurality of conductive gate contacts passing through the gap-fill insulating layer and connected to the plurality of conductive patterns, and the plurality of conductive peripheral circuit contacts passing through the gap-fill insulating layer.

The memory controller 1110 may be configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include a read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (DATA), a small computer system interface (SCSI), an enhanced small disk interface (ESDI), and integrated drive electronics (IDE), FIG. 18 is a block diagram illustrating a configuration of a computing system according to an embodiment of the present disclosure.

Figure 18:
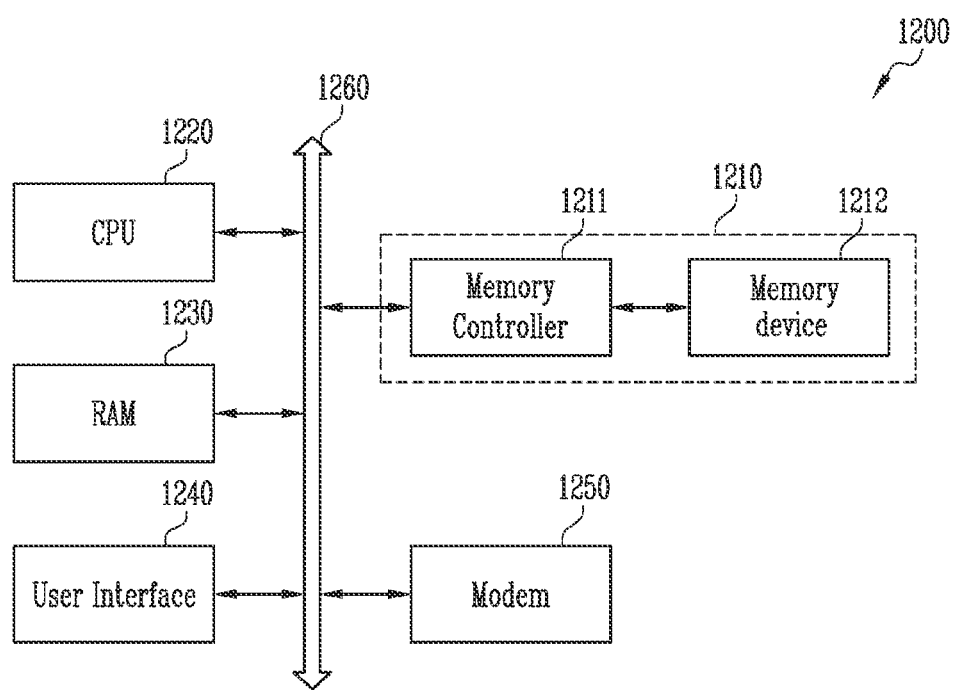
FIG. 18 is a block diagram illustrating a configuration of a computing system according to an embodiment of the present disclosure.

Referring to FIG. 18, the computing system 1200 may include a CPU 1220, a random access memory (RAM) 1230, a user interface 1240, a modem 1250, and a memory system 1210 electrically connected to a system bus 1260, When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211.

The memory device 1212 may include the gate stack, the dummy stack, the plurality of step-shaped grooves defined at different depths in the gate contact region of the gate stack, the plurality of openings passing through the dummy stack and spaced apart from each other, the gap-fill insulating layer filling the plurality of step-shaped grooves and the plurality of openings, the plurality of conductive gate contacts passing through the gap-fill insulating layer and connected to the plurality of conductive patterns, and the plurality of conductive peripheral circuit contacts passing through the gap-fill insulating layer.

The memory controller 1211 may be configured the same as the memory controller 1110 described with reference to FIG. 17.

According to the present disclosure, in some embodiments, the plurality of openings for the plurality of conductive peripheral circuit contacts may be formed using an etching process for defining the plurality of step-shaped grooves in the gate stack. Accordingly, in some embodiments, because a separate process for forming the plurality of openings may be omitted, a manufacturing process of the semiconductor memory device may be simplified.

What is claimed is:

1. A semiconductor memory device comprising:
   a gate stack including a cell array region and a gate contact region, and comprising a plurality of first interlayer insulating patterns and a plurality of conductive patterns alternately stacked;
   a dummy stack comprising a plurality of second interlayer insulating patterns and a plurality of sacrificial insulating layers alternately stacked in a direction in which the plurality of first interlayer insulating patterns and the plurality of conductive patterns are alternately stacked;
   a plurality of step-shaped grooves spaced apart from each other in the gate contact region of the gate stack and defined at different depths in the gate stack;
   a plurality of openings passing through the dummy stack and spaced apart from each other;
   a first gap-fill insulating pattern ng the plurality of step-shaped grooves;
   a second gap-fill insulating pattern filling the plurality of openings;
   a plurality of conductive gate contacts passing through the first gap-fill insulating pattern and connected to the plurality of conductive patterns; and
   a plurality of conductive peripheral circuit contacts passing through the second gap-fill insulating pattern.

2. The semiconductor memory device of claim 1, wherein the plurality of openings includes a first opening and a second opening having a cross-sectional area narrower than a cross-sectional area of the first opening.

3. The semiconductor memory device of claim 2, wherein the plurality of conductive peripheral circuit contacts include at least two first conductive peripheral circuit contacts insulated from each other in the first opening by the second gap-fill insulating pattern.

4. The semiconductor memory device of claim 3,
   wherein the plurality of conductive peripheral circuit contacts include second conductive peripheral circuit contacts disposed in the second opening, and wherein there are fewer numbers of the second conductive peripheral circuit contacts than that of the first conductive peripheral circuit contacts.

5. The semiconductor memory device of claim 1, wherein each of the plurality of step-shaped grooves include a step-shaped sidewall, and
a sidewall of each of the plurality of openings has a flatness higher than a flatness of the step-shaped sidewall.

6. The semiconductor memory device of claim 1, wherein the gate stack and the dummy stack are formed on an etch stop layer.

7. The semiconductor memory device of claim 6, wherein a portion of the etch stop layer is in contact with the second gap-fill insulating pattern.

8. A method of manufacturing a semiconductor memory device, the method comprising:
forming a stack by alternately stacking a plurality of first material layers with a plurality of second material layers;
forming a plurality of preliminary step-shaped grooves at a first depth in a gate contact region of the stack;
forming a plurality of step-shaped grooves at different depths by etching a portion of the plurality of preliminary step-shaped grooves; and
forming a plurality of openings spaced apart from each other in a peripheral circuit contact region of the stack by etching the peripheral circuit contact region of the stack while the plurality of preliminary step-shaped grooves are etched.

9. The method of claim 8, wherein each of the plurality of preliminary step-shaped grooves includes a plurality of box regions, and
forming the plurality of step-shaped grooves comprises;
etching the plurality of box regions so that the plurality of box regions of the plurality of preliminary step-shaped grooves are moved to a second depth greater than the first depth; and
performing a vertical etching process for at least one box region so that the at least one box region among the plurality of box regions moved to the second depth is moved to a depth at which a lowest layer of the plurality of first material layers and the plurality of second material layers are disposed.

10. The method of claim 9, wherein the plurality of openings are formed by performing the vertical etching process.

11. The method of claim 8, further comprising:
forming a gap-fill insulating layer filling the plurality of openings and the plurality of step-shaped grooves;
forming a slit insulating layer passing through the gap-fill insulating layer and passing through the stack between the gate contact region and the peripheral circuit contact region; and
forming a slit passing through a cell array region of the stack, and extending through the gate contact region of the stack and toward the slit insulating layer.

12. The method of claim 11, further comprising:
replacing a portion of the plurality of first material layers with a plurality of conductive patterns through the slit in the gate contact region and the cell array region of the stack.

13. The method of claim 11, further comprising:
forming a plurality of conductive gate contacts passing through the gap-fill insulating layer and extending into the plurality of step-shaped grooves; and
forming a plurality of conductive peripheral circuit contacts passing through the gap-fill insulating layer and extending into the plurality of openings, while forming the conductive gate contacts.

14. The method of claim 11, wherein the stack and the gap-fill insulating layer are formed on an etch stop layer.

15. The method of claim 14, wherein the gap-fill insulating layer is formed of a material having an etch selectivity with respect to the etch stop layer.

16. The method of claim 14, wherein the plurality of openings include a bottom surface defined by a surface of the etch stop layer.

* * * * *